(12) United States Patent
Pagnanelli

(10) Patent No.: US 8,264,390 B2
(45) Date of Patent: Sep. 11, 2012

(54) CONVERSION OF A DISCRETE TIME QUANTIZED SIGNAL INTO A CONTINUOUS TIME, CONTINUOUSLY VARIABLE SIGNAL

(75) Inventor: Christopher Pagnanelli, Huntington Beach, CA (US)

(73) Assignee: Syntropy Systems, LLC, Costa Mesa, CA (US)

( * ) Notice: Subject to any disclaimer, the term of this patent is extended or adjusted under 35 U.S.C. 154(b) by 27 days.

(21) Appl. No.: 12/970,379

(22) Filed: Dec. 16, 2010

(65) Prior Publication Data
US 2011/0140942 A1 Jun. 16, 2011

Related U.S. Application Data

(60) Provisional application No. 61/287,079, filed on Dec. 16, 2009.

(51) Int. Cl.
*H03M 1/66* (2006.01)
(52) U.S. Cl. .................................. 341/144; 341/145
(58) Field of Classification Search .................. 341/144, 341/145, 118, 120, 136, 150, 154; 345/204, 345/205
See application file for complete search history.

(56) References Cited

U.S. PATENT DOCUMENTS

| | | | | |
|---|---|---|---|---|
| 5,341,135 A | * | 8/1994 | Pearce | 341/120 |
| 5,907,242 A | * | 5/1999 | Gard | 324/326 |
| 7,633,417 B1 | | 12/2009 | Yeh | |
| 2004/0208249 A1 | | 10/2004 | Risbo et al. | |

OTHER PUBLICATIONS

A. Fernandez-Vazquez and G. Jovanovic-Dolecek, "Design of Real and Complex Linear-Phase IIR Modified QMF Banks," IEEE Asia Pacific Conference on Circuits and Systems, 2006.

P. C. R. Brandao and A. Petraglia, "A Switched-Capacitor Hadamard Filter Bank in 0.35 m CMOS," Proceedings: 48th Midwest Symposium on Circuits and Systems, 2005.

P. M. Furth and A. G. Andreou, "A Design Framework for Low Power Analog Filter Banks", IEEE Transactions on Circuits and Systems I: Fundamental Theory and Applications, 1995.

R. Khoini-Poorfard, L. B. Lim, and D. A. Johns, "Time-Interleaved Oversampling A/D Converters: Theory and Practice," IEEE Transactions on Circuits and Systems II: Analog and Digital Signal Processing, 1997.

K. Chao, S. Nadeem, W. Lee, and C. Sodini, "A Higher Order Topology for Interpolative Modulators for Oversampling A/D Converters," IEEE Transactions on Circuits and Systems, 1990.

International search report and written opinion from corresponding PCT application U.S. Appl. No. PCT/US2010/060789.

(Continued)

*Primary Examiner* — Joseph Lauture
(74) *Attorney, Agent, or Firm* — Joseph G. Swan, P.C.

(57) ABSTRACT

Provided are, among other things, systems, apparatuses, methods and techniques for converting a discrete-time quantized signal into a continuous-time, continuously variable signal. An exemplary converter preferably includes: (1) multiple oversampling converters, each processing a different frequency band, operated in parallel; (2) multirate (i.e., polyphase) delta-sigma modulators (preferably second-order or higher); (3) multi-bit quantizers; (4) multi-bit-to-variable-level signal converters, such as resistor ladder networks or current source networks; (5) adaptive non-linear, bit-mapping to compensate for mismatches in the multi-bit-to-variable-level signal converters (e.g., by mimicking such mismatches and then shifting the resulting noise to a frequently range where it will be filtered out by a corresponding bandpass (reconstruction) filter); (6) multi-band (e.g., programmable noise-transfer-function response) bandpass delta-sigma modulators; and/or (7) a digital pre-distortion linearizer (DPL) for canceling noise and distortion introduced by an analog signal bandpass (reconstruction) filter bank.

34 Claims, 21 Drawing Sheets

OTHER PUBLICATIONS

Eshraghi A et al: "A Comparative Analysis of Parallel Delta—Sigma ADC Architectures", IEEE Transactions on Circuits and Systems Part I: Regular Papers, IEEE Service Center, New York, NY, US, vol. 51, No. 3, Mar. 1, 2004, pp. 450-458, XP011109280, ISSN: 1057-7122, DOI: D01:10.1109/TCSI.2004.823663.

Harris F J et al: "Implementation considerations and limitations for dynamic range enhanced analog to digital converters", IEEE International Conference on Acoustics, Speech, and Signal Processing, 1989. ICASSP-89., May 3, 1989, pp. 1286-1289, XP010083173.

D. Anastassiou "Error Diffusion Coding for A/D Conversion," IEEE Transactions on Circuits and Systems, vol. 36, 1989.

A. Petraglia and S. K. Mitra, "High Speed A/D Conversion Using QMF Banks," Proceedings: IEEE Symposium on Circuits and Systems, 1990.

Aziz, P., "Multi Band Sigma Delta Analog to Digital Conversion", IEEE International Conference on Acoustics, Speech, and Signal Processing, 1994.

S. R. Velazquez, T. Q. Nguyen, and S. R. Broadstone, "Design of Hybrid Filter Banks for Analog/Digital Conversion," IEEE Transactions on Signal Processing, 1998.

* cited by examiner

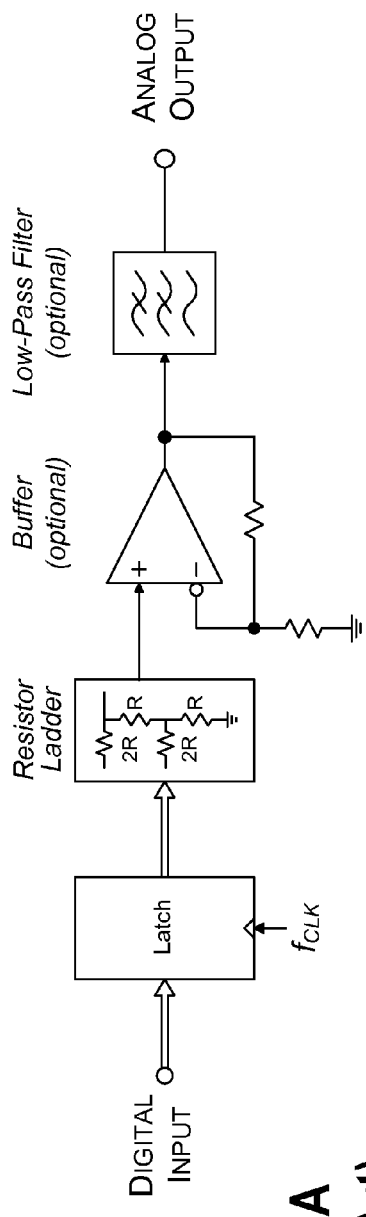
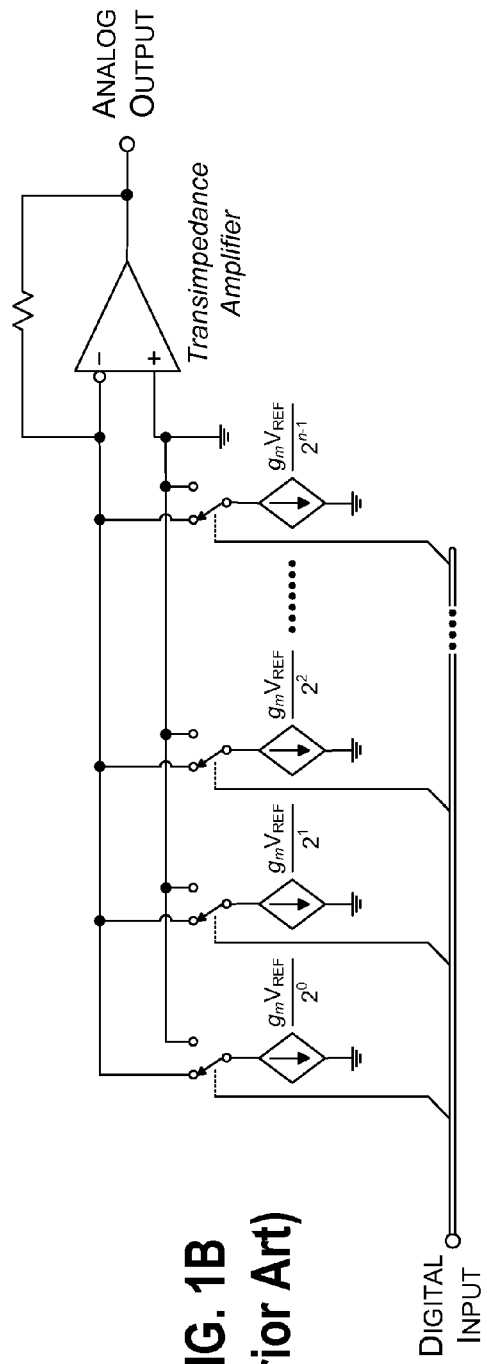
FIG. 1A (Prior Art)
FIG. 1B (Prior Art)

CONVERSION OF A DISCRETE TIME QUANTIZED SIGNAL INTO A CONTINUOUS TIME, CONTINUOUSLY VARIABLE SIGNAL

This application claims the benefit of U.S. Provisional Patent Application Ser. No. 61/287,079, filed on Dec. 16, 2009, and titled "Method of Discrete to Linear Signal Transformation using Orthogonal Bandpass Oversampling (OBO)", which application is incorporated by reference herein as though set forth herein in full.

FIELD OF THE INVENTION

The present invention pertains to systems, methods and techniques for converting a sampled, quantized (discrete-time) signal into a continuous-time continuously variable (linear) signal. It is particularly applicable to very high sample-rate converters with high instantaneous bandwidth.

BACKGROUND

Many applications in modern electronics require that discrete-time signals, generated using computers and digital signal processors, be converted to linear (analog) signals, e.g., for transmission as electromagnetic signals. Typically, this transformation is made using a conventional digital-to-analog converter (DAC). However, the present inventor has discovered that each of the presently existing converters exhibits shortcomings that limit overall performance at very high sample rates.

Due to parallel processing and other innovations, the digital information processing bandwidth of computers and signal processors has advanced beyond the capabilities of state-of-the art DACs. Therefore, converters with higher instantaneous bandwidth are desired. Existing solutions are limited by instantaneous bandwidth (sample rate), effective conversion resolution (accuracy), or both.

The resolution of a DAC is a measure of the precision with which a quantized signal can be transformed into a continuous-time continuously variable signal, and typically is specified as a ratio of the total signal power to the total noise and distortion power at the DAC output. This signal-to-noise-and-distortion ratio (SNDR) of a DAC is commonly expressed on a logarithmic scale in units of decibels (dB). When a discrete-time discretely variable (digital) signal is converted into a continuous-time continuously variable (analog) signal, the quality of the analog signal is corrupted by various limitations and errors introduced during the conversion process. Examples include: (1) the finite granularity of the DAC digital inputs (bit width) that produces quantization noise, (2) the imprecise (e.g., non-linear) mapping of digital inputs to corresponding discrete output voltage or current levels that introduces distortion in the form of rounding inaccuracies (errors), (3) the imperfect timing between transitions in output voltages or currents relative to transitions in digital inputs that causes noise in the form of sampling jitter, and (4) the thermal noise associated with active devices (e.g., switches and amplifiers) that couples onto the DAC output. High-resolution converters transform discrete signals into continuously variable signals using a rounding operation with finer granularity and more-linear mapping of digital inputs to output voltage and current. Instantaneous conversion bandwidth is limited by the Nyquist criterion to a theoretical maximum of one-half the converter sample rate (the Nyquist limit). However, high-resolution conversion (of $\geq 10$ bits) conventionally has been limited to instantaneous bandwidths of about a few gigahertz (GHz) or less.

Converters that quantize signals at a sample rate ($f_S$) that is at or slightly above a frequency equal to twice the signal bandwidth ($f_B$) with several or many bits of resolution are conventionally known as Nyquist-rate converters. Prior-art Nyquist-rate converter architectures include those implemented using resistor ladder networks (e.g., R-2R networks), or those employing switched current/voltage sources with unary (i.e., equal) weighting or binary weighting. A conventional resistor-ladder DAC, such as that shown in FIG. 1A, generates a variable output voltage equal to the binary-weighted sum of multiple, two-level (i.e., digital) inputs. The voltage summation operation is performed using a network of resistors, having appropriately weighted resistance (i.e., a binary-weighted resistor ladder). The voltage at the resistor network output sometimes is buffered and/or sometimes is smoothed, using an analog low-pass filter, to produce a continuously variable signal. An alternative DAC structure is illustrated in FIG. 1B, which instead of a resistor ladder network, uses a switched bank of current sources to generate a variable output current equal to the binary-weighted sum of digital inputs. As shown in FIG. 1B, the output current sometimes is converted to a proportional output voltage using a transimpedance amplifier (i.e., a current-to-voltage converter).

Conventional Nyquist converters potentially can achieve very high instantaneous bandwidths, but as discussed in greater detail below, the present inventor has discovered that component mismatches in the resistor ladder network, or in the switched current sources, can introduce rounding errors that significantly limit attainable resolution. In addition, the resolution of conventional Nyquist converters is limited by other practical implementation impairments such as sampling jitter and thermal noise. Although Nyquist converters potentially could realize high resolution at instantaneous bandwidths greater than 10 GHz in theory, due to the foregoing problems, this potential has been unrealized in conventional Nyquist converters.

Another conventional approach that attempts to reduce quantization noise and errors uses an oversampling technique. A conventional Nyquist converter transforms each digital input into a single proportional output sample (i.e., voltage or current). Conventional oversampling converters first transform each digital input into sequence of pseudorandom, two-valued samples (i.e., a positive value or a negative value), such that the average of this two-valued, pseudorandom sequence is proportional to the digital input. Therefore, oversampling converters generate coarse analog voltage or current outputs at a rate (i.e., $f_S$) that is much higher than twice the input signal bandwidth (i.e., $f_S \gg f_B$), where $N = \frac{1}{2} \cdot f_S / f_B$ is conventionally referred to as the oversampling ratio of the converter. A continuously variable output that is proportional to the digital inputs is produced from the two-valued, pseudorandom output sequence using a low-pass filtering operation that effectively averages the output samples. Although this averaging process reduces the bandwidth of the oversampling converter, it has the benefit of improving the converter resolution by mitigating quantization noise (i.e., the noise introduced by using only two values to represent a continuously variable signal) and errors resulting from component mismatches, sampling jitter, and thermal noise. The extent of this benefit is directly related to the output sample rate $f_S$ (i.e., benefit increases as sample rate increases) and is conventionally enhanced using oversampling in conjunction with a noise-shaping operation that ideally attenuates quantization noise and errors in the signal bandwidth, without also attenuating the signal itself. Through a quantization noise-shaping operation and subsequent low-pass filtering (i.e., output averaging), oversampling converters transform a high-rate intermediate signal having low resolution into a relatively low bandwidth output signal having improved resolution.

FIGS. 2A&B illustrate block diagrams of conventional, low-pass oversampling converters 5A and 5B, respectively. A typical conventional oversampling converter employs an up sampling operation 6, generally consisting of upsampling 6A by the converter oversampling ratio N followed by interpolation (low-pass) filtering 6B, and uses a delta-sigma (ΔΣ) modulator 7A&B to shape or color quantization noise. As the name implies, a delta-sigma modulator 7A&B shapes the noise that will be introduced by two-level quantizer 10 by performing a difference operation 8 (i.e., delta) and an integration operation 13A&B (i.e., sigma), e.g., $$I(z) = \frac{1}{1-z^{-1}}.$$

The converter 5A, shown in FIG. 2A, uses what is conventionally referred to as an interpolative ΔΣ modulator 7A. An alternative ΔΣ modulator 7B having the error-feedback structure shown in FIG. 2B is used in converter 5B. See D. Anastassiou "Error Diffusion Coding in A/D Conversion," IEEE Transactions on Circuits and Systems, Vol. 36, 1989. Generally speaking, the delta-sigma modulator processes the signal with one transfer function (STF) and the quantization noise with a different transfer function (NTF). Conventional transfer functions (i.e., after accounting for the implicit delay of the two-level quantizer 10) are of the form $STF(z)=z^{-1}$ and $NTF(z)=(1-z^{-1})^P$, where $z^{-1}$ represents a unit delay equal to $T_{CLK}=1/f_{CLK}$, and P is called the order of the modulator or noise-shaped response. The STF frequency response 30 and NTF frequency response 32 for a delta sigma modulator with P=1 are shown in FIG. 2C. For both circuits 5A&B, the output sample rate $f_S$, and therefore the converter oversampling ratio N, is determined by the clock frequency $f_{CLK}$ of the delta-sigma modulator 7A&B (i.e., shown as the input clock to the two-level quantizer 10 in FIGS. 2A&B).

The delta-sigma converters 5A&B illustrated in FIGS. 2A&B are conventionally known as low-pass, delta-sigma converters. A variation on the conventional low-pass converter employs bandpass delta-sigma modulators to allow conversion of narrowband signals that are centered at frequencies above zero. An exemplary bandpass oversampling converter 40A, illustrated in FIG. 3A, includes a bandpass delta-sigma modulator 42 that shapes noise from two-level quantizer 10 by performing a difference operation 8 (i.e., delta) and an integration operation 13C (i.e., sigma), respectively, where $$H(z) = -\frac{z^{-1}}{1+z^{-2}}.$$

The conventional bandpass ΔΣ modulator, shown in FIG. 3A, is considered second-order (i.e., P=2) and, after accounting for the implicit delay of the two-level quantizer 10, has a $STF(z)=z^{-1}$ and a $NTF(z)=1+z^{-2}$, where $z^{-1}$ represents a unit delay equal to $T_{CLK}$. The noise transfer function (NTF) of a real bandpass delta-sigma modulator is at minimum a second-order response. Like the low-pass version, the bandpass ΔΣ modulator has a signal response 70, shown in FIG. 3B, that is different from its quantization noise response 71. As shown in FIG. 3B, the bandpass modulator of FIG. 3A has a NTF with a minimum 72 at the center of the converter Nyquist bandwidth (i.e., $\frac{1}{4} \cdot f_S$). After two-level quantization 10, filtering 43 of quantization noise, similar to that performed in the standard conventional low-pass oversampling converter (e.g., either of converters 5A&B) is performed. In FIG. 3A, it is assumed that the input data (i.e., digital input) rate is equal to the converter output sample rate $f_{CLK}$, and therefore, an upsampling operation is not included. However, in cases where the input data rate is lower than the converter output sample rate $f_{CLK}$, an upsampling operation would be included.

The present inventor has discovered that conventional low-pass ΔΣ converters, as illustrated in FIGS. 2A&B, and conventional bandpass ΔΣ converters, as illustrated in FIG. 3A, have several disadvantages that limit their utility in applications requiring very high instantaneous bandwidth and high resolution. These disadvantages, which are discussed in greater detail in the Description of the Preferred Embodiment(s) section, include: (1) conversion bandwidth that is limited by the narrow low-pass or narrow bandpass filtering operations used to attenuate shaped quantization noise and errors, (2) resolution (SNDR) that is limited by the clock frequency $f_{CLK}$ of the delta-sigma modulator (i.e., the clock frequency of a two-level quantizer), and (3) resolution that is limited by the low-order noise-shaped response (i.e., generally second-order for bandpass modulators) needed for stable operation with two-level quantizers. Because of these disadvantages, the resolution of conventional oversampling converters cannot be increased without: (1) reducing bandwidth to improve the quantization noise attenuation of the output (smoothing) filters, or (2) increasing the converter sample rate by using higher-speed circuits since high-order modulators are unstable with two-level quantization. In addition, conventional oversampling converters employ delta-sigma modulator structures that do not provide a means of dynamically varying, or re-programming, the frequency ($f_{notch}$) at which the quantization noise frequency response is a minimum. However, the present inventor has discovered that such a feature can be advantageous in multi-mode applications (e.g., frequency synthesizers and tunable radios) where, depending on its programming, a single converter preferably can operate on different (multiple) frequency bands.

SUMMARY OF THE INVENTION

The present invention provides an improved DAC, particularly for use at very high sample rates and instantaneous bandwidths approaching the Nyquist limit. The improved DAC overcomes the resolution limitations of conventional Nyquist converters and the bandwidth limitations of conventional oversampling converters.

Thus, one specific embodiment of the invention is directed to an apparatus for converting a discrete-time quantized signal into a continuous-time, continuously variable signal that includes: an input line for accepting an input signal that is discrete in time and in value; multiple processing branches coupled to the input line; and an adder. Each of the processing branches includes: (a) a discrete-time noise-shaping/quantization circuit, (b) a multi-bit-to-variable-level signal converter coupled to an output of the discrete-time noise-shaping/quantization circuit, and (c) an analog bandpass filter coupled to an output of the multi-bit-to-continuously-variable signal converter. The adder is coupled to an output of the analog bandpass filter in each of the processing branches. The discrete-time noise-shaping/quantization circuits in different ones of the processing branches have conversion-noise frequency-response minima at different frequencies, with each of the discrete-time noise-shaping/quantization circuits having a conversion-noise frequency-response minimum that corresponds to a frequency band selected by the analog bandpass filter in the same processing branch. It is noted that in applications where conversion at zero frequency (i.e., DC) is desired, one of the processing branches preferably includes an analog bandpass filter that is centered at zero frequency to produce a low-pass response.

Such an apparatus typically can provide a better combination of high resolution and wide bandwidth than is possible with conventional converters and can be used for various commercial, industrial and military applications, e.g., in various direct conversion transmitters, software-defined or cognitive radios, multi-channel communication transmitters, all-digital RADAR systems, and high-speed arbitrary waveform generators.

An alternate specific embodiment of the invention is directed to an apparatus for converting a discrete-time quantized signal into a continuous-time, continuously variable signal that includes: an input line for accepting an input signal that is discrete in time and in value; a discrete-time noise-shaping/quantization circuit having an input coupled to the input line and having multiple parallel paths, each such parallel path generating a different subsampling phase of a complete signal that is output by the discrete-time noise-shaping/quantization circuit; a multi-bit-to-variable-level signal converter coupled to an output of the discrete-time noise-shaping/quantization circuit; and an analog bandpass filter coupled to an output of the multi-bit-to-continuously-variable signal converter. The discrete-time noise-shaping/quantization circuit has a conversion-noise frequency-response minimum that corresponds to a frequency band selected by the analog bandpass filter.

Another specific embodiment of the invention is directed to an apparatus for converting a discrete-time quantized signal into a continuous-time, continuously variable signal that includes: an input line for accepting an input signal that is discrete in time and in value; an adder having a first input coupled to the input line, a second input and an output; a multi-bit-to-variable-level signal converter coupled to the output of the adder; an analog bandpass filter coupled to an output of the multi-bit-to-continuously-variable signal converter; a non-linear bit-mapping component, having an input coupled to the output of the adder and also having an output, that scales different bits of a multi-bit signal at its input by different multi-bit factors; and a feedback-loop filter having an input coupled to the output of the non-linear bit-mapping component and an output coupled to the second input of the adder.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the attached drawings. However, it should be understood that the drawings merely depict certain representative and/or exemplary embodiments and features of the present invention and are not intended to limit the scope of the invention in any manner. The following is a brief description of each of the attached drawings.

FIG. 1A is a block diagram of a conventional DAC that converts binary-weighted digital inputs to binary-weighted voltage outputs using a resistor ladder network, a buffer amplifier and an analog smoothing (low-pass) filter; and FIG. 1B is a block diagram of a conventional DAC that converts binary-weighted digital inputs to binary-weighted voltage outputs using switched current sources and a transimpedance amplifier.

DESCRIPTION OF THE PREFERRED EMBODIMENT(S)

A preferred converter according to the present invention uses a technique that sometimes is referred to herein as Multi-Channel Bandpass Oversampling (MBO). In a somewhat comparable manner to conventional, oversampling digital-to-analog converters, the MBO converter employs a form of "oversampling" (as that term is broadly used herein) in conjunction with noise shaping to mitigate the resolution-degrading effects of quantization error, sampling jitter, and thermal noise. An MBO converter according to the preferred embodiments of the present invention incorporates one or more of the following technological innovations to improve instantaneous bandwidth and resolution: (1) multiple oversampling converters (e.g., each processing a different frequency band), are operated in parallel to overcome the bandwidth limitations of conventional oversampling converters; (2) multirate (i.e., polyphase) delta-sigma modulators (preferably second-order or higher) are used in place of conventional delta-sigma modulators so that the effective oversampling ratio of the modulator is not strictly dependent on the quantizer clock frequency fax; (3) multi-bit quantizers are used in conjunction with multi-bit-to-variable-level signal converters, such as resistor ladder networks, or current source networks, to allow stable operation with noise-shaped responses that are higher than second-order; (4) adaptive non-linear, bit-mapping is used to compensate for mismatches in the multi-bit-to-variable-level signal converters (e.g., by mimicking such mismatches and then shaping the resulting noise into a frequently range where it will be filtered out by a corresponding bandpass (reconstruction) filter); (5) multi-band (e.g., programmable NTF response) delta-sigma modulators are used in place of single-band (i.e., fixed NTF response) delta-sigma modulators to enable a single modulator circuit to be configured for operation on arbitrary frequency bands; and (6) a digital pre-distortion linearizer (DPL) that cancels noise and distortion introduced by an analog signal bandpass (reconstruction) filter bank is used so that an analog signal reconstruction filter bank, based on standard analog filter structures, can effectively attenuate conversion noise and errors without introducing appreciable amplitude and phase distortion. Certain combinations of such techniques can in some respects be thought of as unique and novel methods of combining two distinct conventional techniques—continuous-time, bandpass oversampling and multi-channel, frequency-interleaving. As discussed in more detail below, the use of such techniques often can overcome the problems of limited conversion resolution and precision at very high instantaneous bandwidths.

Figure 4:
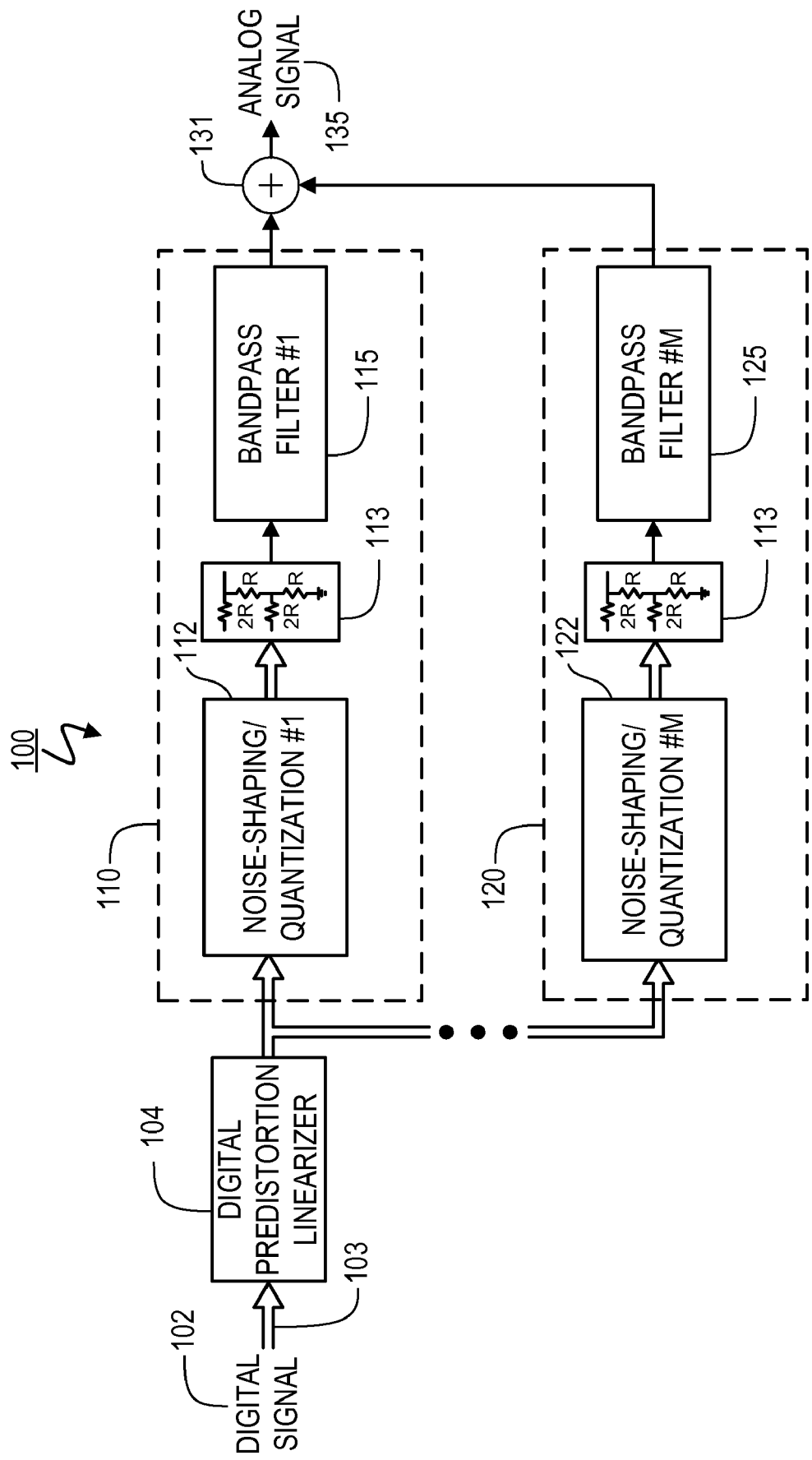
FIG. 4 is a simplified block diagram of a Multi-Channel Bandpass Oversampling (MBO) converter that uses multiple processing branches, according to a representative embodiment of the present invention.

A simplified block diagram of one converter 100 according to the preferred embodiments of the present invention is illustrated in FIG. 4. The converter 100 generally operates on the principle of frequency interleaving, with the total bandwidth of a discrete-time input signal 102 being conceptually separated (i.e., subdivided) into multiple, smaller sub-bands that are independently transformed (in separate processing branches) into continuous-time signals that are then recombined in order to produce an output signal with the same bandwidth as the input signal. The word "conceptually" is used in the preceding sentence because in converter 100, only after transformation into continuous-time signals is the frequency-band separation performed. However, prior to that point, the processing is performed in anticipation of such ultimate frequency-band separation.

In a conventional interleaved converter, each sub-converter in the interleaved array operates at a submultiple of the overall sample rate, due to the reduced signal bandwidth in each of the subdivided bands. In contrast, converter 100 according to the present invention separately processes M different frequency bands, with each band preferably operating at the full overall sample rate, rather than at a submultiple of the overall sample rate. This approach results in an effective oversampling ratio of M, sometimes referred to herein as an "interleaved oversampling ratio" or "interleave factor". It should be noted that the interleave factor M is different from the excess rate oversampling ratio N of a conventional oversampling converter, but generally has the same or similar effect on conversion noise and errors.

It is noted that, except to the extent specifically indicated to the contrary, the term "oversampling" is used herein in a broad sense, referring to processing techniques in which a signal, or some portion of the signal, is digitally represented during some intermediate stage at a higher sample rate (but typically at a lower resolution) than the signal, or portion thereof, that ultimately is output. In the preferred embodiments of the present invention, the input digital signal 102 is processed in different channels or branches (e.g., branches 110 and 120), the purpose of each being to reproduce a different frequency band. Then, the outputs of all such channels or branches 110 and 120 are combined to provide the final output signal 135. As discussed in greater detail below, the processing rate within each channel or branch is higher than the bandwidth of the corresponding frequency band that ultimately is output from such channel or branch, resulting in the effective oversampling.

Referring to FIG. 4, converter 100 processes a digital (discrete-time) input signal 102 as M different frequency bands, using a separate branch (e.g., branch 110 or 120) to process each such band, and then sums up all the branch outputs in an adder 131 in order to provide the output analog signal 135. In one embodiment of the invention, the M different frequency bands are orthogonal, or at least approximately orthogonal, with respect to the output data rate of the overall converter 100. More specifically, the signal 102 (typically multi-bit) is input on a line 103 that could be implemented, e.g., as a physical port for accepting a multi-bit external signal or as internal wires, conductive traces or a similar conductive paths for receiving a multi-bit signal from another circuit within the same device.

In the present embodiment, the samples of the digital input signal 102 are first coupled directly to a digital pre-distortion linearizer (DPL) 104. As used herein, the term "coupled", or any other form of the word, is intended to mean either directly connected or connected through one or more other processing blocks, e.g., for the purpose of preprocessing. One function of the DPL 104 preferably is to convert the input signal 102 into a sufficiently long word length for further processing (e.g., up to 16 bits). The output of the DPL 104 is distributed for processing to M different branches (e.g., branch 110 and 120), each corresponding to a different frequency band and each preferably including: (1) a discrete-time noise-shaping/quantization circuit (e.g., noise shaper and quantizer 112 and 122), a multi-bit-to-variable-level signal converter such as a resistor ladder network 113, and a bandpass (signal reconstruction) filter (e.g., filter 115 and 125). Lastly, an adder 131 sums the outputs of these M branches (more specifically, the outputs of the signal reconstruction filters) to produce the final output signal 135. Often, for ease of reference, the following discussion refers only to the components of branch 110, it being understood that similar processing preferably occurs in each of the other branches (e.g., branch 120).

The term "adder", as used herein, is intended to refer to one or more circuits for combining two or more signals together, e.g., through arithmetic addition and/or (by simply including an inverter) through subtraction. The term "additively combine" or any variation thereof, as used herein, is intended to mean arithmetic addition or subtraction, it being understood that addition and subtraction generally are interchangeable through the use of signal inversion. The term "bandpass", as used herein, refers to a filter or other circuit that provides higher gain for a desired band of frequencies as compared to other frequencies within the input signal, where the desired band could be centered at zero (in which case it could be referred to as a low-pass filter) or at any other frequency.

The main purpose of the DPL 104 is to compensate for amplitude and phase distortion (i.e., imperfect reconstruction), delay skew, and phase distortion introduced by the analog signal reconstruction filter bank (consisting of bandpass filters 115 and 125 and the bandpass filters in each of the other branches). In the embodiment shown in FIG. 4, each discrete-time noise-shaping/quantization circuit 112 has a multi-bit output (e.g., 6 to 8 bits), but use of discrete-time noise-shaping/quantization circuits 112 instead having a single-bit output also is within the scope of the invention. In any event, each such noise-shaping/quantization circuit 112 preferably reduces the word length (and, correspondingly, the resolution) of its input signal so that a less-complex resistor ladder network 113 (or other structure for conversion to a single multi-level continuous-time signal) can be used.

In the present embodiment, the typically multi-bit output of each noise-shaping/quantization circuit 112 is converted into a single variable-level signal that switches among a fixed number of discrete levels when the output of the corresponding noise-shaping/quantization circuit 112 changes, via a resistor ladder network 113 (i.e., R-2R). However, other multi-bit-to-variable-level signal converters 113 known in the art, such as binary-weighted or unary-weighted current sources, instead may be used. Finally, the M channels preferably are combined in adder 131 using summing resistors, but in alternate embodiments any of various other (e.g., other conventional) analog adders 131, including passive and/or active signal combining structures, instead may be used.

Essentially, in the preferred embodiments, the present invention overcomes the problems of limited conversion resolution and precision at high instantaneous bandwidths via a novel method of combining two established techniques—bandpass oversampling and a variant of frequency interleaving. By combining multiple bandpass noise-shaped channels in parallel, such that each noise-shaping circuit minimizes conversion noise in a particular region of the converter's Nyquist bandwidth, the present invention can provide a frequency interleaved converter simultaneously having high resolution and high instantaneous bandwidth.

Noise-Shaping and Quantizing Considerations

Figure 2A:
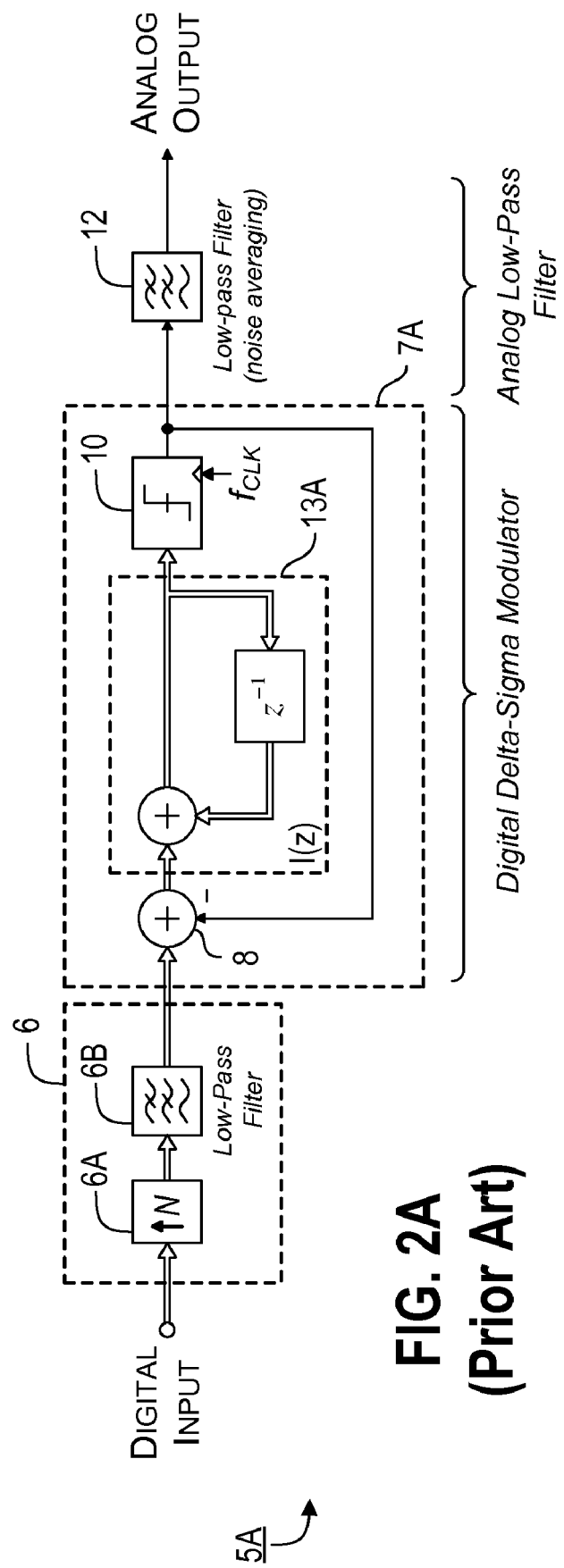
FIG. 2A is a block diagram of a conventional low-pass oversampling converter having an interpolative delta-sigma modulator with first-order response and two-level quantization.
Figure 2B:
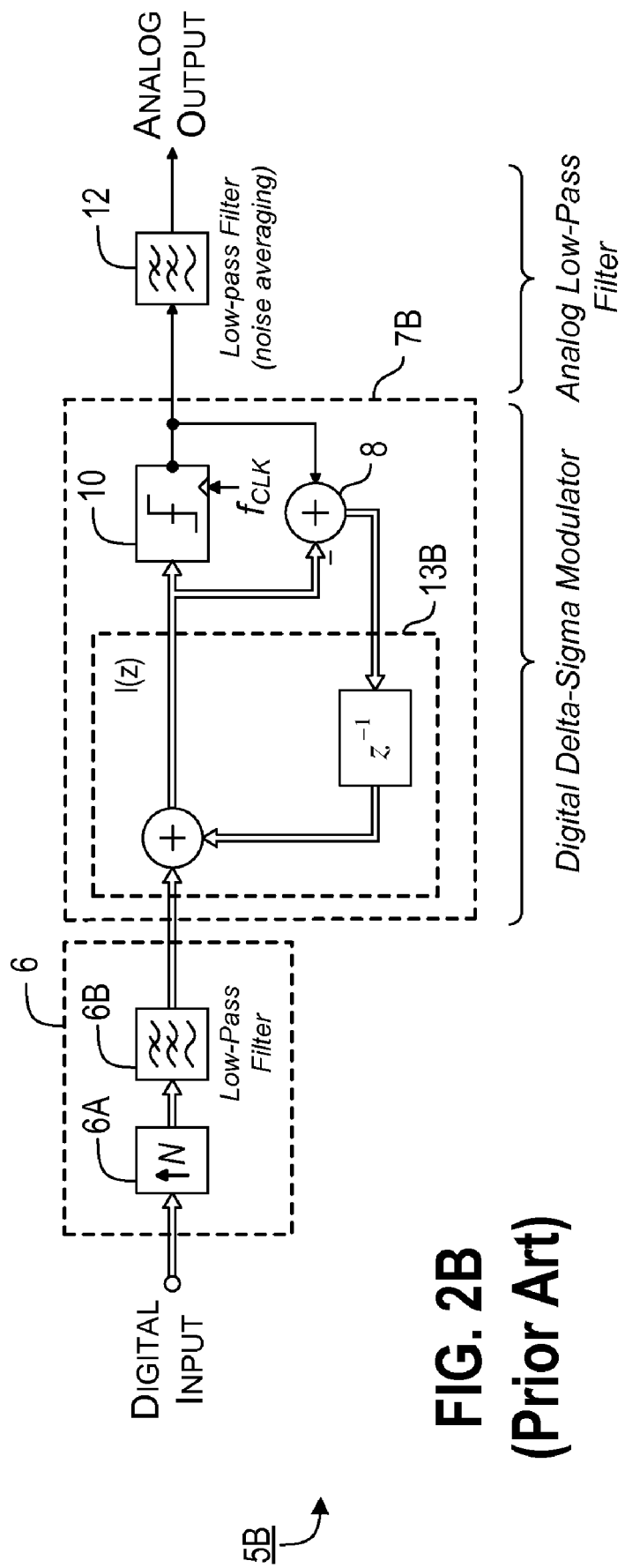
FIG. 2B is a block diagram of a conventional low-pass oversampling converter having an error-feedback delta-sigma modulator with first-order response and two-level quantization.
Figure 2C:
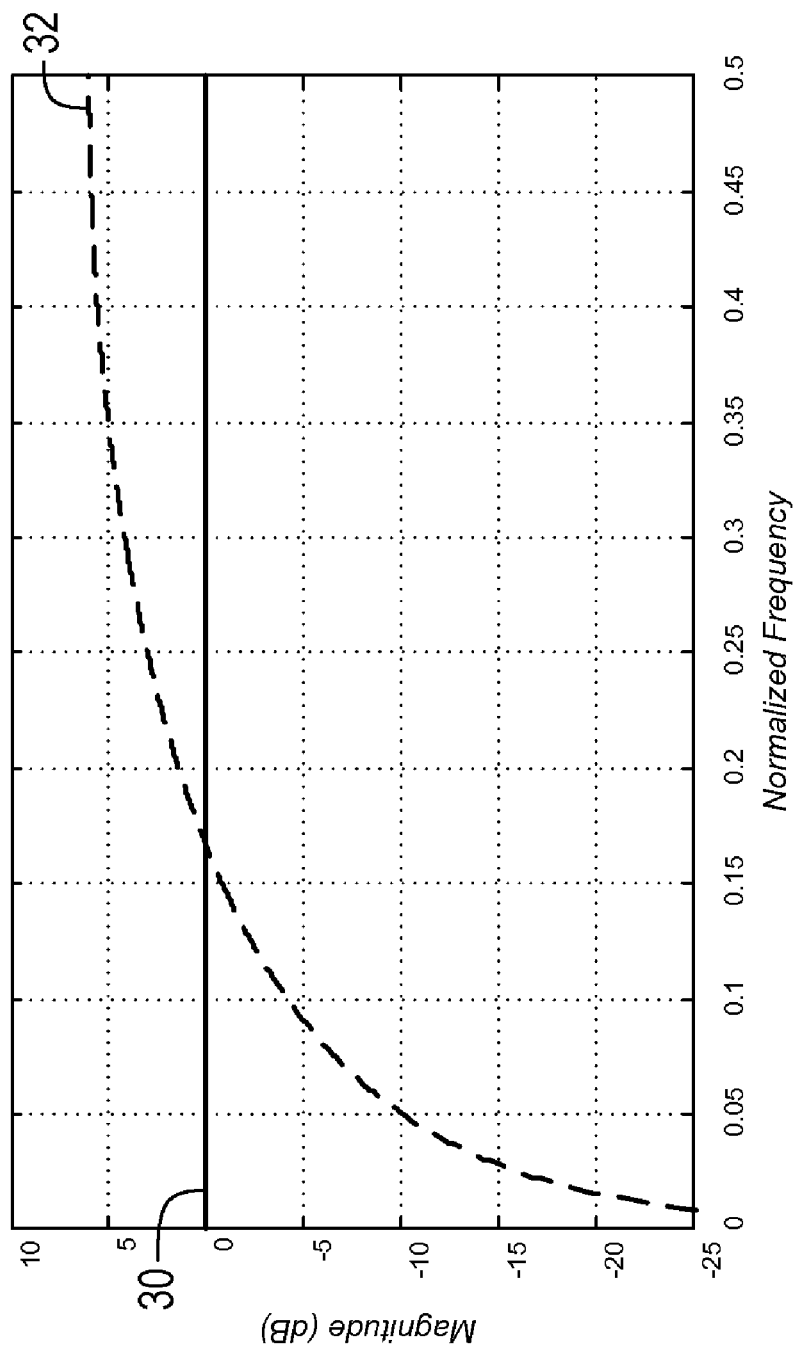
FIG. 2C illustrates the input signal transfer function (STF) and quantization-noise transfer function (NTF) for a conventional, first-order, low-pass delta-sigma modulator.
Figure 3A:
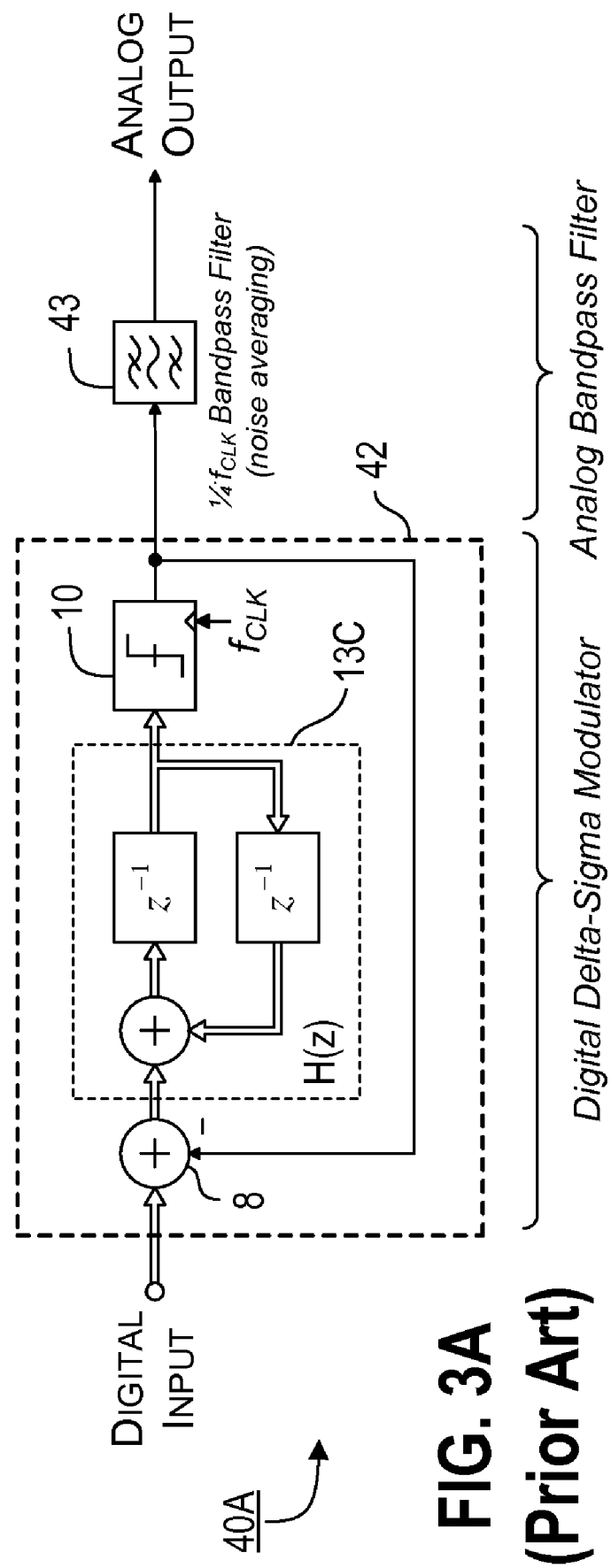
FIG. 3A is a block diagram of a single-band bandpass oversampling converter having a discrete-time, interpolative delta-sigma modulator with second-order response and two-level quantization.
Figure 3B:
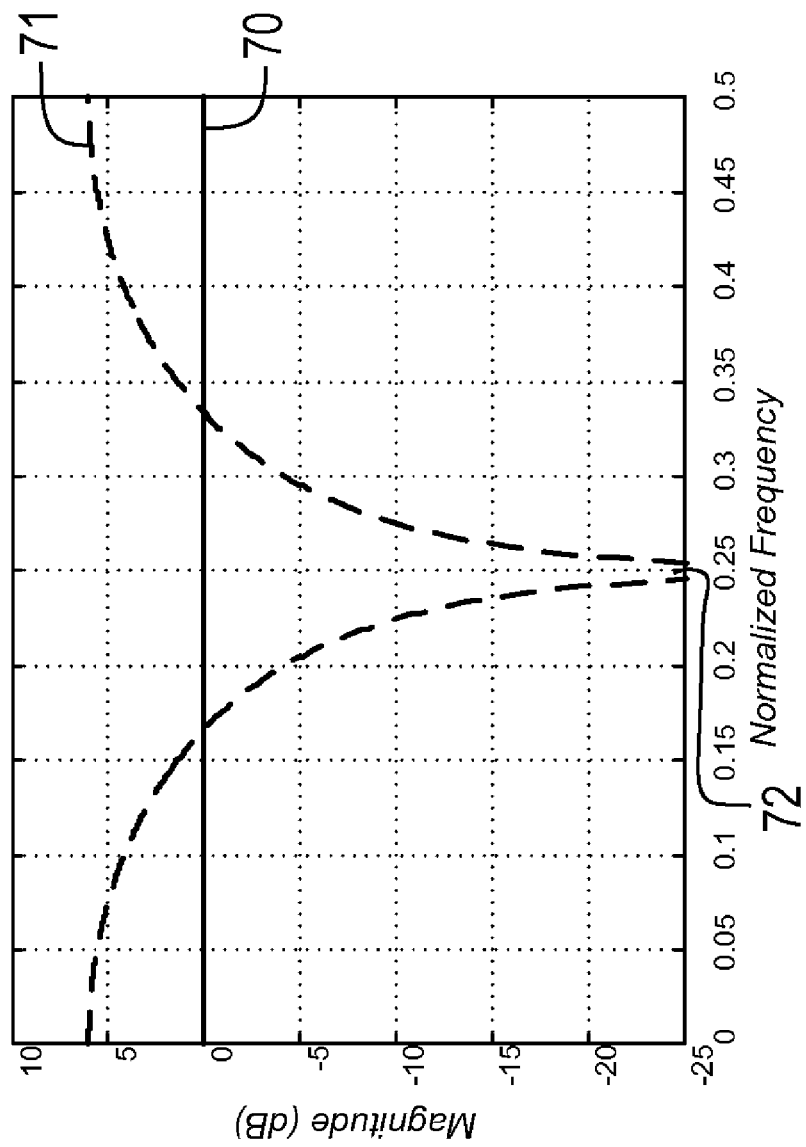
FIG. 3B illustrates the input signal transfer function (STF) and quantization-noise transfer function (NTF) for the delta-sigma modulator of the single-band bandpass converter shown in FIG. 3A.
Figure 5:
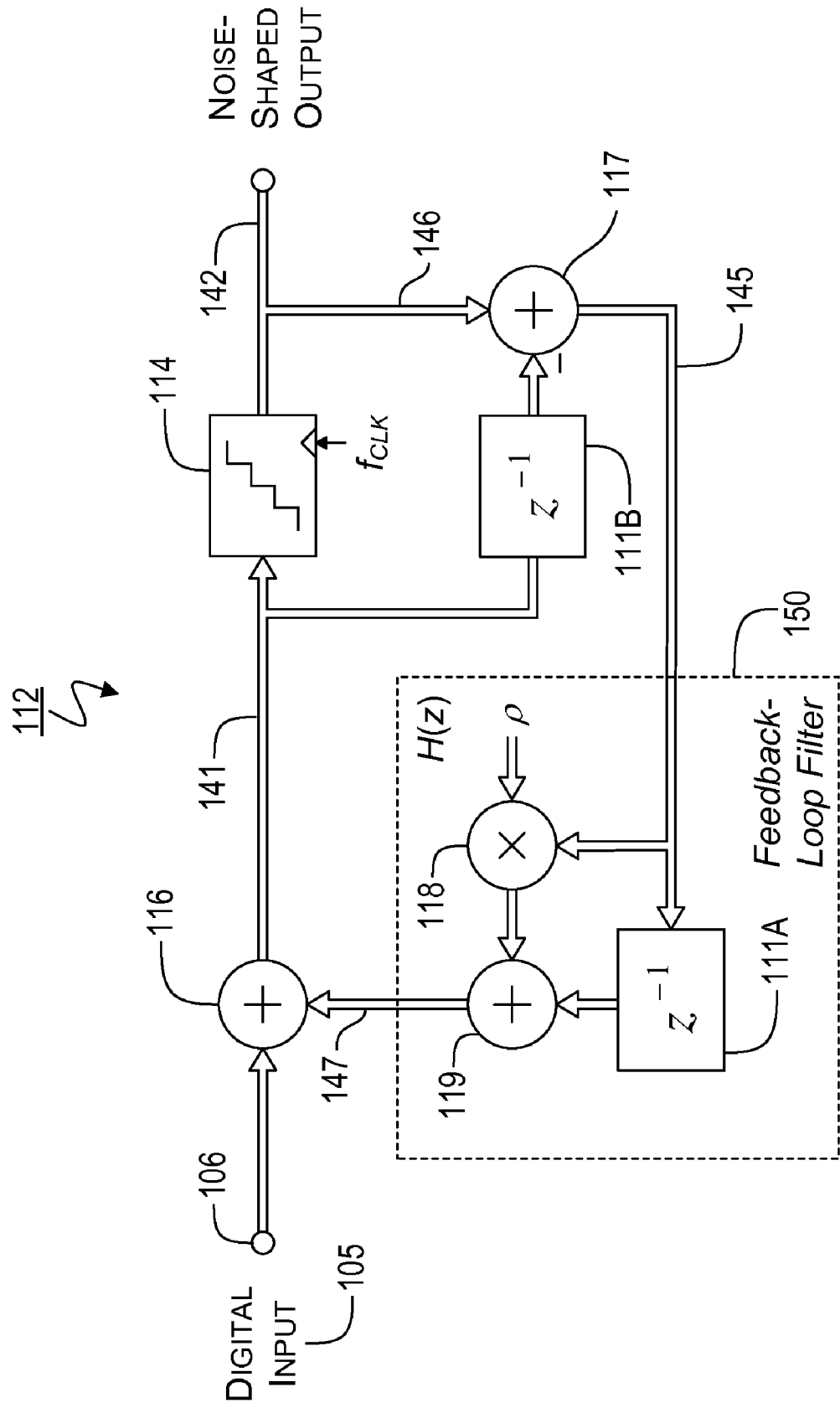
FIG. 5 is a block diagram illustrating a portion of a single branch of a MBO converter that employs a delta-sigma ($\Delta\Sigma$) modulator, with a programmable feedback-loop filter to produce conversion noise response minima at arbitrary frequencies, according to a representative embodiment of the present invention.

In the embodiment described above, each of the noise-shaping/quantization circuits (e.g., 112 and 122) preferably is constructed differently from those shown in FIGS. 2A&B and in FIG. 3. In the preferred embodiments, a modified error-feedback structure, referred to herein as a multirate, delta-sigma ($\mu\Delta\Sigma$) modulator, is used for the conversion noise-shaping portion of the circuit 112 or 122 within each processing branch 110 or 120, respectively, because such a circuit has been found to achieve the best combination of effectiveness, ease of construction and ease of configuration. However, it should be noted that it is possible to use other kinds of noise-shaping circuits, including conventional delta-sigma ($\Delta\Sigma$) modulators, in alternate embodiments of the invention. In any event, the primary considerations for the noise-shaping circuits to be used preferably derive from the desire for stable and accurate operation at very high sample rates. Therefore, each noise-shaping circuit according to the preferred embodiments has at least the following three properties: (1) the primary performance impairments of the noise-shaping circuit, such as those related to quantization/rounding errors, sampling uncertainty/jitter, and thermal noise are subject to a noise-shaped response; (2) the noise-shaping circuit produces stable responses with noise-shaped orders of 4 or greater; (3) the effective oversampling ratio of the noise-shaping circuit is not limited by the maximum clock frequency of the constituent components; and (4) the noise-shaping circuit has an all-pass (or at least approximately all-pass) signal transfer function (STF) and a bandstop noise transfer function (NTF), such that the null in the NTF is determined by the value of a programmable parameter (e.g., a noise shaper feedback-loop filter coefficient). As discussed in greater detail below, the noise that is subject to shaping preferably includes noise introduced by any quantization circuit that is used (e.g., quantization circuit 114 that is internal to circuit 112 and is shown in FIG. 5), but also (or instead) can include noise introduced by other components, such as the a multi-bit-to-variable-level signal converter 113. Achieving these properties generally precludes the use of conventional delta-sigma modulators for the noise-shaping function.

Figure 6:
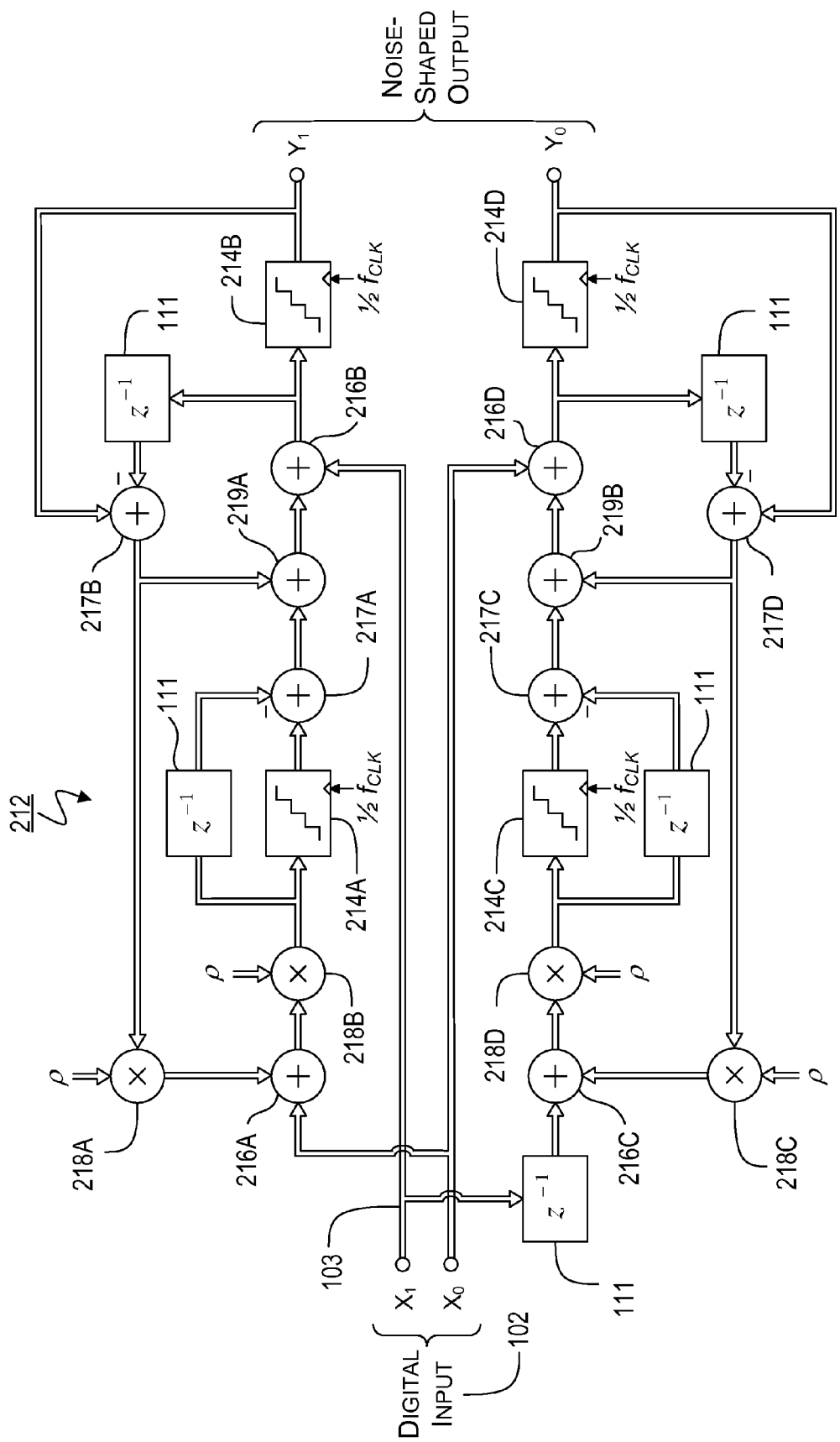
FIG. 6 is a block diagram illustrating a multirate delta-sigma ($\mu\Delta\Sigma$) modulator feedback-loop filter that has a polyphase decomposition factor m=2, according to a representative embodiment of the present invention.

A simplified block diagram of an exemplary noise-shaping/quantization circuit 112, employing a programmable feedback-loop filter 150 in combination with a multi-bit quantization circuit 114, is shown in FIG. 5 for a polyphase decomposition factor of m=1; and a simplified block diagram of an exemplary $\mu\Delta\Sigma$ is shown in FIG. 6 for a polyphase decomposition factor of m=2. Generally speaking, the embodiments described herein refer to a combined noise-shaping/quantization circuit 112. The reason for this usage is that, particularly when m≧2, it can be difficult to neatly separate the quantization components from the noise-shaping components. However, the functionalities are in fact distinct and, particularly when m=1, it sometimes is desirable to conceptualize such components separately, e.g., as shown in FIG. 5.

Whereas a conventional delta-sigma (ΔΣ) modulator has an oversampling ratio $N=\frac{1}{2} \cdot f_S/f_B$, the multirate delta-sigma (μΔΣ) modulators illustrated in FIGS. 5&6 have an excess-rate oversampling ratio $N'=\frac{1}{2} \cdot m \cdot f_S/f_B$, where m is the polyphase decomposition factor of the μΔΣ modulator. In general, the circuit complexity of the μΔΣ modulator (e.g., the number of quantizers 114) increases as $m^2$. It should be noted that although the μΔΣ modulator is a parallel processing structure, a μΔΣ modulator is different from a conventional MASH (i.e., Multi-stAge SHaping) modulator, which conventionally is sometimes referred to as a "parallel" modulator. In a MASH structure, conventional ΔΣ modulators are grouped in a parallel arrangement to increase the order P of the NTF noise-shaped response. In contrast, the parallel μΔΣ modulator architecture increases the effective oversampling ratio N', regardless of the noise-shaped response order P.

In a μΔΣ modulator, as most clearly illustrated in FIG. 5, a signal 141 (that is output from adder 116 and input into quantizer 114 is delayed 111B (e.g., by one $f_{CLK}$ cycle) and is subtracted from signal 146 in subtractor 117. The resulting combined signal 145 is filtered 150, using a filter transfer function H(z), thereby resulting in signal 147. Finally, signal 147 is combined with the input signal 102 in adder 116. Similar processing is illustrated in FIG. 6, although in that embodiment the components that constitute the μΔΣ modulator have been replicated in order to realize a polyphase decomposition factor of m=2. Therefore, the μΔΣ modulator 212 of FIG. 6 can operate at one-half the $f_{CLK}$ rate for the same oversampling ratio N, or can achieve twice the oversampling ratio (i.e., 2N) for the same $f_{CLK}$ rate. The process of replicating hardware to reduce clock rates (i.e., lower $f_{CLK}$) or increase processing speed (i.e., increase N) sometimes is referred to in the prior art as polyphase decomposition or multirate processing.

Generally speaking, the addition of the correction signal 147 to the input signal 103 ensures that future quantizer output samples 142 on average will compensate for earlier quantization errors, while the preprocessing of the quantization error prior to such addition ensures that the quantization noise introduced by quantizer 114 will be shifted away from the frequency band of the input signal that is being processed (i.e., the frequency band remaining after processing by the reconstruction filter) by the current processing branch (e.g., branch 110 or 120). Depending upon the value of the feedback-loop filter parameter, ρ, filter 150 can cause conversion noise to be shifted away from a selected (e.g., predetermined) frequency within the overall converter Nyquist bandwidth, equal to $\frac{1}{2} \cdot m \cdot f_{CLK}$.

The μΔΣ modulator feedback-loop filter 150 introduces frequency-dependent delaying and frequency-dependent amplitude variation to the feedback signal 145, such that the μΔΣ modulator noise transfer function (NTF) has a bandstop response with a null at a predetermined frequency (i.e., a frequency determined by feedback-loop filter parameter ρ). In the present embodiment, the feedback-loop filter 150 uses a multiplier 118, an adder 119 and a delay register 111A to produce a frequency response with the correct amount of frequency-dependent delaying and frequency-dependent amplitude variation. As will be readily appreciated, multiplier 118 can be replaced by a combination of shift and add components to potentially reduce feedback-loop filter complexity, especially for the case where the feedback-loop filter parameter ρ can be represented by a small number of digital bits (i.e., ρ's binary representation contains few terms). The term "adder", as used herein, is intended to refer to one or more circuits for combining two or more signals together, e.g., through arithmetic addition and/or (by simply including an inverter) through subtraction. The term "additively combine" or any variation thereof, as used herein, is intended to mean arithmetic addition or subtraction, it being understood that addition and subtraction generally are interchangeable through the use of signal inversion.

As illustrated in FIGS. 5&6, the μΔΣ modulator preferably is implemented in conjunction with a multi-bit quantization circuit 114 (or quantization circuits 214A-D in FIG. 6), which (in reference to FIG. 5) reduces the rounding precision (i.e., granularity or bit-width) of the quantizer input 141 relative to the quantizer output 142. A multi-bit quantizer 114, and more preferably a multi-bit quantizer 114 having a granularity of 4 or more bits, has been found to ensure stable operation for μΔΣ modulators with shaping response orders (i.e., shaping factors) of P>2. For shaping factors of P≦2, modulator stability is not contingent on the use of multi-bit quantizers, and therefore in such embodiments, the multi-bit quantizers shown in FIGS. 5&6 preferably are replaced by single-bit (i.e., two-level) quantizers to reduce circuit complexity, especially for polyphase decomposition factors of m>1.

Like conventional μΣ modulators, the μΔΣ modulator processes the input signal 102 with one transfer function (STF) and the conversion noise (e.g., from quantizer 114 in reference to FIG. 5) with a different transfer function (NTF). Referring to the circuit shown in FIG. 5, the linearized signal transfer function (STF) and noise transfer function (NTF), between the input 103 and the output of the quantization circuit 114, are:

$$STF(z)=z^{-1},$$

$$NTF(z)=1+H(z)$$

Therefore, the signal response is all-pass and the noise response depends on the μΔΣ feedback-loop filter function, H(z). To produce noise nulls at predetermined frequencies across the Nyquist bandwidth of the converter, the feedback-loop filter 150 preferably has a second-order transfer function of the form $$H(z)=\rho \cdot z^{-1}+z^{-2},$$

where ρ is a programmable value. Then, the noise transfer function is given by $$NTF(z) = 1 + H(z) = 1 + \rho \cdot z^{-1} + z^{-2}$$

and the location of the noise minimum is determined by the coefficient ρ. To produce noise minima across the entire converter band, it is preferable for ρ to be capable of varying over a range of −2 to +2. Specifically, a ρ equal to $$\rho = -2 \cdot \cos(2 \cdot \pi \cdot f/(m \cdot f_{CLK})),$$

produces a noise minimum, or null, at a frequency equal to f (i.e., the bandpass frequency of a given processing branch), where $f_{CLK}$ is the quantizer clock frequency.

The effective oversampling ratio of an MBO converter, according to the preferred embodiments of the invention, is equal to the product of the interleaved oversampling ratio M, equal to the number of parallel processing branches, and the excess-rate oversampling ratio N', equal to $\frac{1}{2} \cdot m \cdot f_{CLK}/f_B$. Therefore, the resolution performance of an MBO converter can be increased independently of N by increasing the number M of parallel processing branches 110 (i.e., increasing the number of noise-shaping/quantization circuits 112). However, processing branches are added at the expense of increasing the number of analog bandpass filters (e.g., filters 115 and 125) in the output signal reconstruction filter bank, while simultaneously increasing the minimum quality factor ($Q=f_C/BW_{3dB}$) of each such filter 115. Problems with controlling filter-bank aliasing (or other distortions), coupled with the design complexities associated with building multiple high-Q analog filters, generally makes increasing the interleave factor, M, a less desirable alternative than increasing the excess-rate oversampling ratio, N', for increasing the effective oversampling ratio of the converter. Therefore, the MBO converter preferably has an excess-rate oversampling ratio N'>1.

Conventionally, increasing the oversampling ratio N is realized by increasing the $f_{CLK}$ rate of the noise-shaping modulator. As mentioned previously, however, the effective excess-rate oversampling ratio N' of a μΔΣ modulator is not limited by $f_{CLK}$ due to the multirate (i.e., polyphase) operation of the μΔΣ modulator. Polyphase decomposition of the μΔΣ modulator into parallel paths allows the effective sampling rate ($f_S$) of the converter to increase without increasing the $f_{CLK}$ rate of the modulator. For illustrative purposes, consider a noise-shaping/quantization circuit 112 as illustrated in FIG. 5 with $H(z) = \rho \cdot z^{-1} + z^{-2}$ and $NTF(z) = 1 + \rho \cdot z^{-1} + z^{-2}$.

The quantized output 142 of the noise-shaping/quantization circuit 112, Q(y), can be represented by the difference equation $Q(y_n) = Q[x_n + \rho \cdot Q(y_{n-1}) - \rho \cdot y_{n-1} + Q(y_{n-2}) - y_{n-2}]$, and therefore, the difference equations for the first two output samples (i.e., n=0, 1) are $Q(y_0) = Q[x_0 + \rho \cdot Q(y_{-1}) - \rho \cdot y_{-1} + Q(y_{-2}) - y_{-2}]$ and $Q(y_1) = Q[x_1 + \rho \cdot Q(y_0) - \rho \cdot y_0 \cdot Q(y_{-1}) - y_{-1}]$.

Substitution of $y_0$ into $y_1$ results in $Q(y_1) = Q[x_1 + \rho \cdot Q(x_0 + \rho \cdot Q(y_{-1}) - \rho \cdot y_{-1}) - \rho \cdot (x_0 + \rho \cdot Q(y_{-1}) - \rho \cdot y_{-1}) + Q(y_{-1}) + y_{-1}]$, which can be generalized to $Q(y_n) = Q[x_n + \rho \cdot Q(x_{n-1} + \rho \cdot Q(y_{n-2}) - \rho y_{n-2}) - \rho \cdot (x_{n-1} + \rho \cdot Q(y_{n-2}) - \rho \cdot y_{n-2}) + Q(y_{n-2}) + y_{n-2}]$.

Thus, $Q(y_n)$ can be calculated using only inputs and every other output for the above example, demonstrating that the μΔΣ modulator can be instantiated via a parallel processing architecture (i.e., two parallel paths) using the polyphase decomposition technique illustrated above. That is, the present output of each parallel path is solely dependent upon: the signal that is input to the overall noise-shaping/quantization circuit 112, signals generated within such path itself and/or prior outputs from various other parallel paths, but is independent of the present outputs from any other parallel path. In the above example, parallel processing enables the μΔΣ modulator to run at one-half the $f_{CLK}$ rate for the same oversampling ratio N, or at twice the oversampling ratio for the same $f_{CLK}$ rate. This polyphase decomposition approach, described above for a polyphase decomposition factor of m=2, can be extended to higher polyphase decomposition factors and an arbitrary feedback-loop filter function (H(z)). This is an important consideration, particularly for high-sample-rate converters. FIG. 6 illustrates a μΔΣ modulator having a polyphase decomposition factor of m=2 per the above example. As indicated above, when m≧2 each of the parallel paths generates a different subsampling phase of the complete signal that is output by the discrete-time noise-shaping/quantization circuit 112 of the branch 110. As used herein, a "subsampling phase" refers to one of the k possible phases or time offsets at which subsampling by a factor k of can occur.

Each of the μΔΣ circuits shown in FIGS. 5 & 6 has a second-order noise-shaped response. However, higher-order noise-shaped responses result in improved converter resolution performance, because higher-order noise-shaped responses shift more noise away from the desired frequency band of the input signal (i.e., the frequency band for the current processing branch 110 or 120 that is selected by the corresponding bandpass filter 115 or 125, respectively) than lower-order noise-shaped responses, thereby increasing the amount of noise attenuated by the branch's bandpass (signal reconstruction) filter. For example, for a sixth-order noise-shaped response, the feedback-loop filter H(z) shown in FIG. 5 has the general transfer function $$H(z) = NTF(z) - 1$$
$$= (1 - \rho_0 z^{-1} + z^{-2}) \cdot (1 - \rho_1 z^{-1} + z^{-2}) \cdot (1 - \rho_2 z^{-1} + z^{-2}) - 1$$
$$= -(\rho_0 + \rho_1 + \rho_2) \cdot z^{-1} + (3 + \rho_0\rho_1 + \rho_0\rho_2 + \rho_1\rho_2) \cdot z^{-2} -$$
$$(2\rho_0 + 2\rho_1 + 2\rho_2 + \rho_0\rho_1\rho_2) \cdot z^{-3} +$$
$$(3 + \rho_0\rho_1 + \rho_0\rho_2 + \rho_1\rho_2) \cdot z^{-4} - (\rho_0 + \rho_1 + \rho_2) \cdot z^{-5} + z^{-6}$$

Conventionally, the noise-shaping circuit coefficients (or parameters) $\rho_0$, $\rho_1$, and $\rho_2$ are equal or, equivalently, the zeros of the noise transfer function occur at a common frequency. In the case of roots having equal magnitudes, the resulting noise transfer function simplifies to $$H_1(z) = H_{NOISE}(z) - 1$$
$$= (1 - \rho \cdot z^{-1} + z^{-2})^3 - 1$$
$$= -3 \cdot \rho \cdot z^{-1} + 6 \cdot \rho^2 \cdot z^{-2} - 7 \cdot \rho^3 \cdot z^{-3} + 6 \cdot \rho^2 \cdot z^{-4} - 3 \cdot \rho \cdot z^{-5} + z^{-6}.$$

However, this simplified condition is not necessarily optimal with respect to minimizing output noise, particularly for small interleave factors (M) where there is a correspondingly small number of analog output filters. A high-order modulator having unequal NTF zeros for the purpose of minimizing noise, is conventionally referred to as having a "zero-optimized" NTF. A zero-optimized NTF enables the bandwidth of the NTF bandstop response to be increased at the expense of reducing the depth of the noise null. For small interleave factors M, this difference in noise response can result in improved converter resolution.

For the μΔΣ modulator, however, a NTF with unequal zeros can reduce the circuit complexity associated with the multirate architecture. When feedback structures, such as μΔΣ modulators, are implemented using high-frequency, parallel-processing methods, such as polyphase decomposition, coefficient dynamic range expansion can cause the NTF response to deviate from the preferred NTF response. This occurs because in polyphase feedback structures, input and output values are multiplied by the same coefficient (i.e., ρ) multiple times, causing needed arithmetic precision to grow exponentially. A large number of binary terms (i.e., large bit-widths) are needed to represent values with high precision. This resulting increase in complexity can be offset by using an NTF with unequal zeros from rational coefficients that can be represented by simple fractions, preferably binary fractions (i.e., fractions with denominators that are powers of two), to approximate an NTF with equal zeros from irrational coefficients, or coefficients that cannot be represented by simple fractions. Use of coefficients that can be represented by simple binary fractions (e.g., values represented by no more than 3-8 bits) allows μΔΣ feedback-loop filter multipliers to be replaced by less complex circuits consisting of adders and/or bit-shifting operations. This complexity-reduction technique is an innovative aspect of the present invention that is sometimes referred to herein as "bit-optimization". Therefore, in the preferred embodiments of the invention, μΔΣ modulators with a bit-optimized NTF are employed. It should be noted that zero-optimization for the purpose of reducing complexity (i.e., bit-optimization) is different from conventional zero-optimization for noise reduction. However, sometimes bit-optimization can result in NTFs having beneficial responses compared to NTFs with equal zeros.

Figure 7:
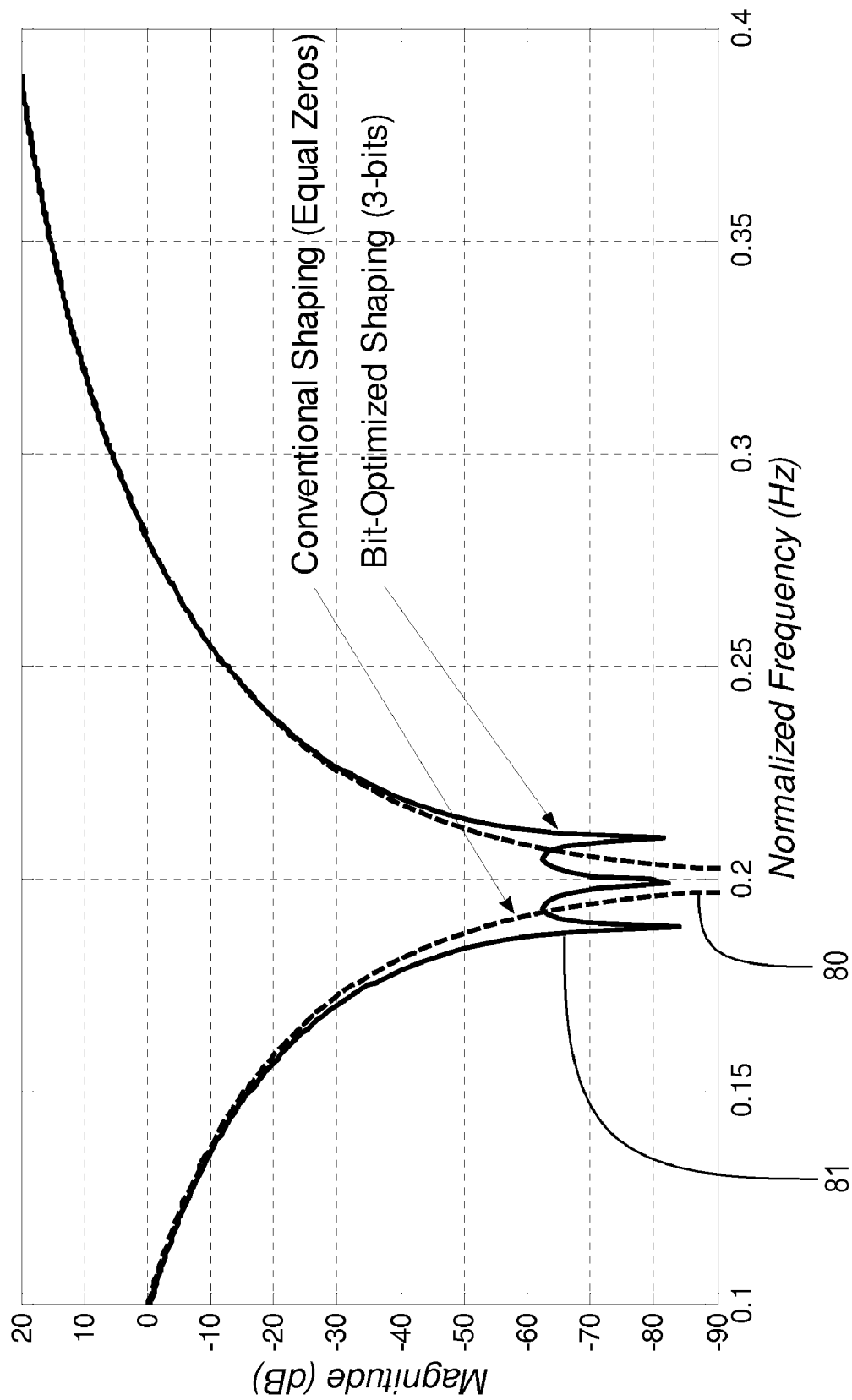
FIG. 7 illustrates the noise transfer function (NTF) of a conventional, single-band bandpass delta-sigma modulator and the noise transfer function of a multirate delta-sigma modulator with bit-width optimized zeros, according to a representative embodiment of the invention.

FIG. 7 illustrates a comparison of the noise transfer functions for two cases: (1) a conventional $6^{th}$ order noise-shaped response with equal zeros, such that $\rho_0=\rho_1=\rho_2=0.6180$ 34 . . . ; and (2) a bit-optimized $6^{th}$ order noise-shaped response with $\rho_0=\frac{1}{2}$, $\rho_1=\frac{5}{8}$, and $\rho_2=\frac{3}{4}$. As shown in FIG. 7, the exemplary NTF with equal zeros 80 has a noise null reaching a depth of greater than 90 dB at a normalized frequency of 0.2 Hz, whereas the depth of the bit-optimized NTF 81 reaches a depth of just greater than 60 dB. However, compared to the NTF with equal zeros 80, the bit-optimized NTF 81 has a 60-dB bandwidth that is approximately 55% wider (0.025 Hz versus 0.016 Hz). For MBO converters with a small number M of parallel processing branches (e.g., 110 and 120), a wider-band NTF with lower maximum attenuation can result in less noise at the output of the signal reconstruction filter 115 than a narrow-band NTF with higher maximum attenuation.

Due to faster accumulation of quantization errors caused by greater amplification of quantization noise in out-of-band regions, when using higher-order noise-shaping circuits 112 it is preferable to use greater than single-bit quantization to ensure that the noise shaper output remains bounded. As a result, the quantizer 114 shown in FIGS. 5&6 preferably is a multi-bit quantizer, and the noise-shaped response is $6^{th}$ order in the preferred embodiments of the invention. However, single-bit quantizers (i.e., comparators) and lower-order noise-shaped responses instead could be used and should be considered to be within the scope of the invention.

Bandpass (Signal Reconstruction) Filter Considerations

The primary considerations for the bandpass filters (e.g., filters 115 and 125) used in MBO signal reconstruction according to the preferred embodiments of the present invention are: (1) design complexity (preferably expressed in terms of filter quality factor and order), (2) frequency response (particularly stopband attenuation), and (3) amplitude and phase distortion. The best converter-resolution performance is obtained for conversion noise-reduction filters (i.e., bandpass or signal reconstruction filters 115) having frequency responses that exhibit high stopband attenuation, which generally increases with increasing filter order. In addition, it is preferable that the filter responses introduce as little amplitude and phase distortion as possible to minimize the complexity of the digital pre-distortion linearizer (DPL) 104. The performance improvement realized by increasing the converter interleave factor (M) is contingent on a proportionate increase in the quality factor of the reconstruction filters, defined as the ratio of the filter center frequency to the filter 3 dB bandwidth (i.e., $f_C/f_{3dB}$). For an MBO converter, according to the preferred embodiments of the invention, the quality factor is calculated for the highest-frequency filter in the reconstruction filter bank (i.e., $f_C=\frac{1}{2}f_S$). Therefore, the preferred quality factor for the analog filters (e.g., filters 115 and 125) is directly related to the interleave factor of the converter and, more preferably, is equal to M. Currently, the quality factor for standard lumped-element or distributed-element analog filters is limited to about 30. As a result, a typical practical limitation on the interleave factor for the MBO converter is M≈32. However, because of the complexity associated with an analog reconstruction filter bank comprised of 32 filters, the preferred embodiments of the invention limit the interleave factor to M=16 or less (i.e., a bank of 16 or fewer analog filters 115).

For an interleave factor of M=16, $5^{th}$ to $7^{th}$ order Butterworth filter responses provide sufficient stopband attenuation of conversion noise. However, the overall response, F(jω), of a bank of these filters does not exhibit the properties necessary for perfect signal reconstruction in frequency-interleaved applications, namely low amplitude and phase distortion. However, with systems according to the preferred embodiments of the present invention, near perfect signal reconstruction is not strictly dependent on the analog filter bank having an all-pass response (i.e., $F(j\omega)=e^{-jn\omega t}$), as is the generally accepted view in the prior art. Instead, it is only desirable that the filter bank response be all-pass in convolution with a second filter transfer function, L(z), implemented by the digital pre-distortion linearizer (DPL) 104 (shown in FIG. 4), such that $$F(j\omega) \cdot L(z) = F(j\omega) \cdot \frac{\sum_{i=0}^{K1} \beta_i \cdot z^{-i}}{1 + \sum_{i=1}^{K2} \alpha_i \cdot z^{-i}} = z^{-n}\bigg|_{z=e^{-j\omega t}}$$

where L(z) is a physically realizable transfer function (e.g., stable and causal). This second filter with transfer function L(z) predistorts the input signal 102 with added phase and/or amplitude distortion, such that the added distortion cancels the analog reconstruction filter bank distortion (i.e., the aggregate distortion across all of the bandpass filters 115, 125, etc.) at the output of the filter bank. As represented in the equation above, the filter 104 preferably employs both feedforward and feedback components (preferably simple weighted delay components), represented by coefficients $\beta_i$ and $\alpha_i$, respectively, in the above equation. The coefficients, $\beta_i$ and $\alpha_i$, for a pre-distortion linearlizer 104 that maximally equalize a particular analog filter bank impulse response can be determined using conventional methods for solving simultaneous linear equations, or can be determined using conventional adaptive techniques such as those employing a least mean squares (LMS) algorithm.

Reduced analog filter bank complexity is one reason why the preferred embodiments of the invention employ one or more pre-distortion linearizing filters 104. A second reason is that linearizers 104 of this type can be employed to correct signal skew caused by propagation delay differences between converter branches or channels (e.g., branches 110 and 120) and between parallel paths in polyphase noise-shaper configurations.

Figure 8A:
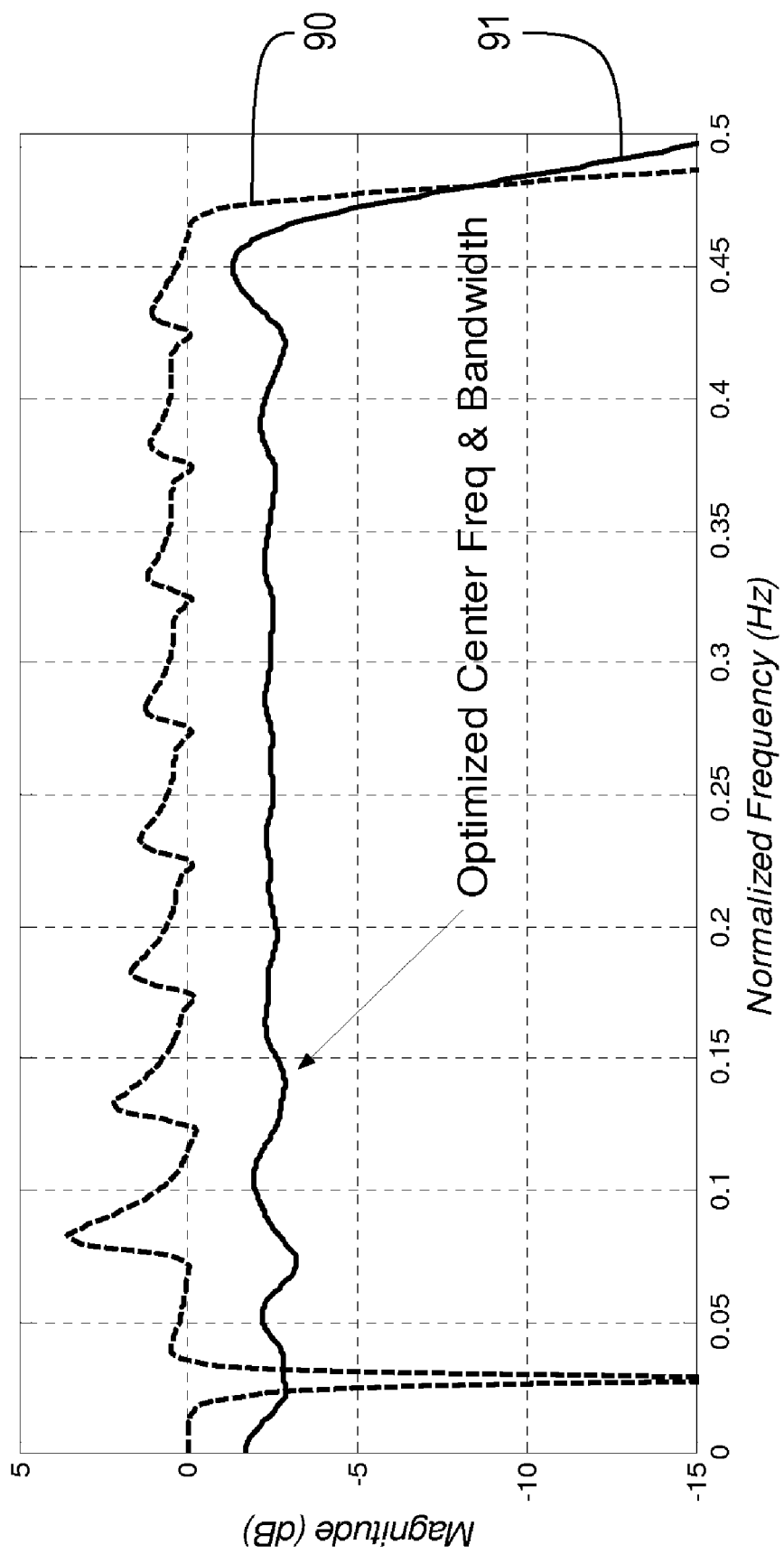
FIG. 8A illustrates the overall frequency responses for different analog signal reconstruction (ASR) filter banks used in a MBO converter according to representative embodiments of the present invention.
Figure 8B:
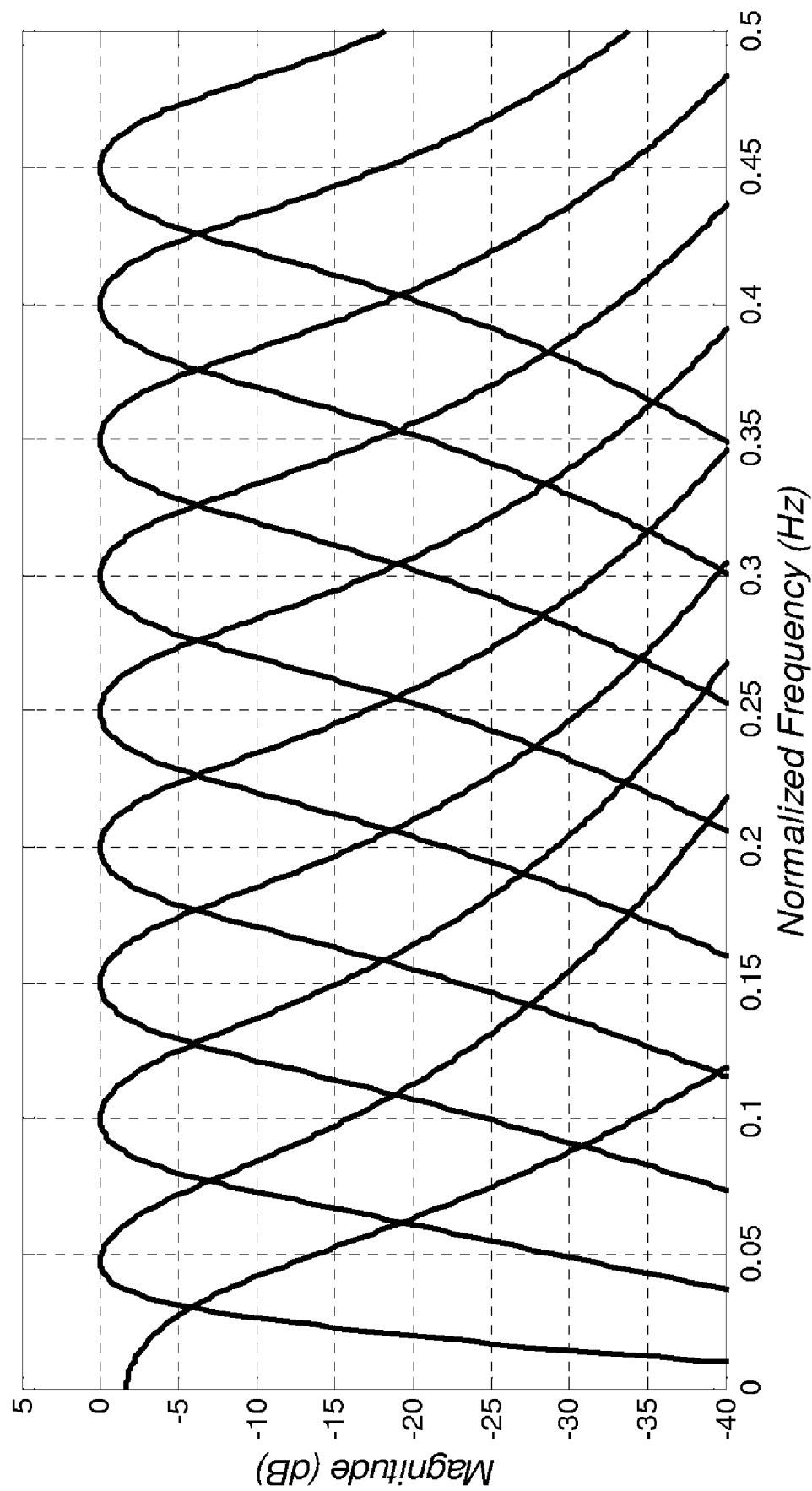
FIG. 8B illustrates the frequency response magnitudes for the individual filters that make up a $3^{rd}$-order Bessel filter bank according to a representative embodiment of the present invention.

To reduce the complexity of the digital pre-distortion linearizer 104, responses for the bandpass filters (e.g., filters 115 and 125) that make up the analog filter bank preferably are selected to minimize the amplitude and phase distortion that produces passband ripple and phase dispersion, respectively. To minimize amplitude and phase distortion in the preferred embodiments, individual analog filter bank responses preferably are optimized with respect to: (a) frequency response, (b) filter order, (c) center frequency, and/or (d) bandwidth. For example, a conventional analog filter bank comprised of $5^{th}$-order Butterworth filters having uniformly distributed center frequencies (i.e., center frequencies distributed evenly across the converter Nyquist bandwidth) and equal bandwidths, has a frequency response magnitude 90, as illustrated in FIG. 8A for an interleave factor of M=10. As shown in FIG. 8A, the frequency response magnitude 90 exhibits passband ripple exceeding 15 dB in a negative direction and exceeding 3 dB in a positive direction. Alternatively, an analog filter bank comprised of $3^{rd}$-order Bessel responses with optimized center frequencies, filter orders, and bandwidths, has a frequency response magnitude 91, as illustrated in FIG. 8A, that exhibits passband ripple of less than ±1 dB across the converter Nyquist bandwidth (M=10). The frequency response magnitude for the individual filters (e.g., filters 115 and 125) that make up the Bessel filter bank are shown in FIG. 8B.

Polyphase decomposition techniques can also be applied to the digital pre-distortion linearizer (DPL) 104 to form a parallel processing structure and reduce the clock rates of the digital multipliers and adders that are used to implement the DPL 104. The DPL 104 preferably is a recursive (i.e., infinite-impulse response or IIR) structure with transfer function L(z) that performs the discrete-time convolution of the data converter input sequence x(n) and the filter coefficients l(n):

$$y(n)=x(n)*l(n) \leftrightarrow Y(z)=X(z) \cdot L(z)=X \cdot L.$$

Assuming, without loss of generality, a pre-distortion linearizer 104 with three coefficients (i.e., $\beta_0$, $\beta_1$, and $\alpha_1$) and transfer function $$L(z) = \frac{\beta_0 + \beta_1 z^{-1}}{1 + \alpha_1 z^{-1}},$$

the operation of the pre-distortion linearizer 104 can be represented by the difference equation $$y_n = \beta_0 x_n + \beta_1 x_{n-1} - \alpha_1 y_{n-1}.$$

Therefore, the difference equations for the first two output samples (i.e., n=1, 2) are $$y_2 = \beta_0 x_2 + \beta_1 x_1 - \alpha_1 y_1 \text{ and } y_1 = \beta_0 x_1 + \beta_1 x_0 - \alpha_1 y_0,$$

and substitution of $y_1$ into $y_2$ results in $$y_2 = \beta_0 x_2 + \beta_1 x_1 - \alpha_1(\beta_0 x_1 + \beta_1 x_0 - \alpha_1 y_0)$$
$$= \beta_0 x_2 + (\beta_1 - \alpha_1 \beta_0)x_1 - \alpha_1 \beta_1 x_0 - \alpha_1 y_0.$$

The above equation can be generalized to $$y_n = \beta_0 x_n + (\beta_1 - \alpha_1 \beta_0) x_{n-1} - \alpha_1 \beta_1 x_{n-2} + \alpha_1 y_{n-2}.$$

Figure 9:
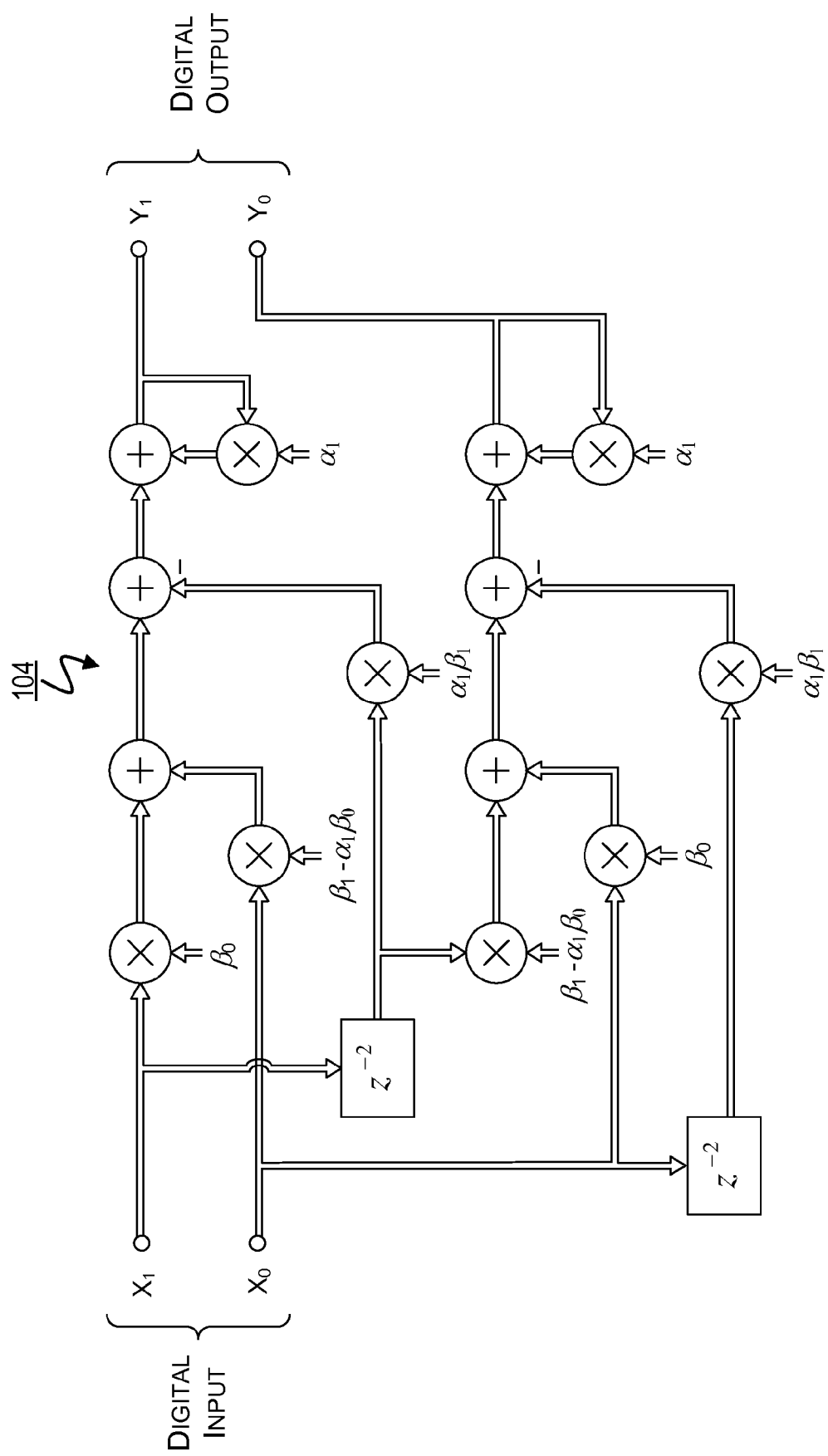
FIG. 9 is a block diagram illustrating a multirate, digital pre-distortion linearizer (DPL) with three coefficients and a polyphase decomposition factor m=2, according to a representative embodiment of the present invention.

Thus, $y_n$ can be calculated using only inputs and every other output for the above example, demonstrating that, like the μΔΣ modulator, the digital pre-distortion linearizer 104 can be implemented as a parallel processing structure with two parallel paths (i.e., polyphase decomposition factor of m=2). In the above example, parallel processing enables the DPL 104 to run at one-half the converter input data rate. This polyphase decomposition approach can be extended to higher polyphase decomposition factors (i.e., m>2) and arbitrary pre-distortion linearizer transfer functions (L(z)), to allow the DPL to run at a sub-multiple of the overall converter sample rate. Polyphase decomposition into parallel paths results in an m-times reduction in processing clock rate at the expense of no greater than m-times increased circuit complexity. This penalty in circuit complexity is generally a favorable alternative in the case of very high-sample rate converters. FIG. 9 illustrates a block diagram of an exemplary digital pre-distortion linearizer 104 having an IIR transfer function with three coefficients and a polyphase decomposition factor of m=2. Therefore, the exemplary circuit shown in FIG. 9 would operate at one-half the overall converter sample rate.

Multi-Bit-to-Variable-Level Signal Converter Considerations

In the preferred embodiments of the invention, the binary weighted outputs of the noise-shaping/quantization circuit 112, shown in FIGS. 4&5, are converted to a single proportional analog voltage level using a modified conventional resistor ladder network. However, other conventional methods for converting a multi-bit signal to a single variable-level output, including current sources, instead may be used and should be considered within the scope of the present invention. Where references are made herein to a resistor ladder network, it should be understood that such references are merely exemplary and generally can be replaced by references to any other multi-bit-to-variable-level signal converter.

Figure 10:
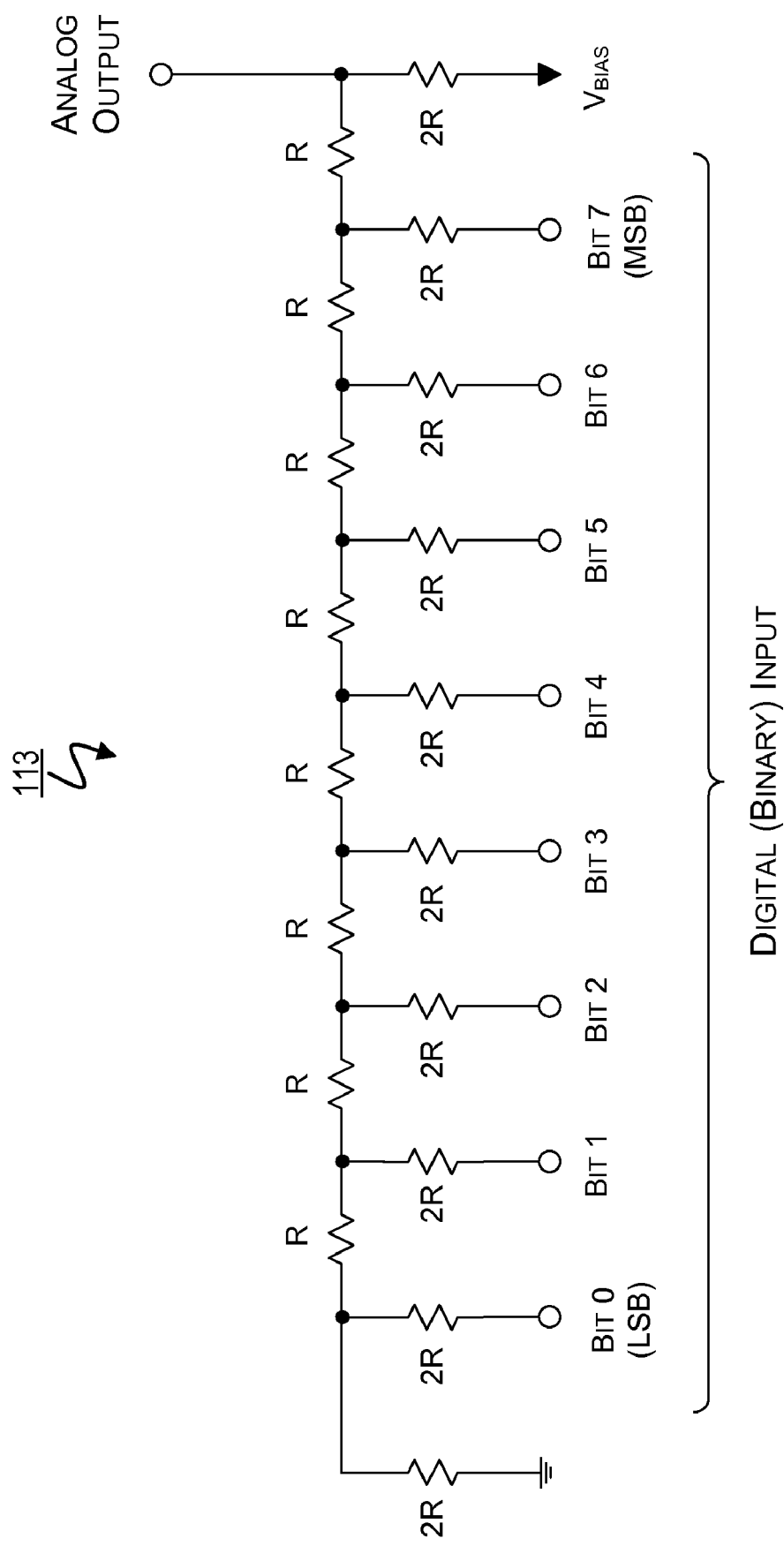
FIG. 10 is a block diagram illustrating an R-2R resistor ladder network, used in a MBO converter according to a representative embodiment of the present invention, for converting a multi-bit digital input to a single, proportional multi-level output voltage.

More specifically, the preferred embodiments of the invention use an R-2R resistor network that has been modified for bipolar operation, where R is matched to the characteristic impedance of the analog filter 115. This impedance is generally between 50 ohms and 100 ohms. FIG. 10 is an exemplary diagram of a conventional resistor ladder, with eight inputs, that has been modified for bipolar operation with the addition of a $V_{BIAS}$ input.

An important consideration for the resistor ladder network is the relative matching of the constituent resistive elements. It is conventionally understood that a perfect resistor ladder creates an analog output by weighting each digital input according to a binary scaling factor. Mismatches in the resistive elements of the ladder distort this binary scaling, producing a non-linear response. This non-linear response distorts the output waveform and, therefore, degrades the quality of the converted analog signal. In conventional converters that employ resistive ladder networks, the matching requirement ($\epsilon$) for the resistive elements is determined by the converter precision according to $$\varepsilon = \frac{1}{2^{B+1}} \cdot 100\%,$$

where B in the above equation is the effective resolution of the converter in bits. Therefore, the required resistor ladder matching is ~0.2% for 8-bit effective resolution.

The oversampled operation of an MBO converter according to the preferred embodiments of the invention affords two advantages over conventional converters that are based on resistor ladder networks. One advantage is that because of noise shaping and filtering, oversampled converters require resistor ladders with fewer inputs to achieve the same effective resolution as non-oversampled converters. Thus, oversampling reduces the overall complexity of the resistor ladder network. The reduction in the required number of resistor ladder inputs is a function of the converter effective oversampling ratio (N'×M), the noise-shaping order (P) of the $\mu\Delta\Sigma$ modulators within the noise-shaping/quantization circuits 112, and the stopband attenuation of the signal reconstruction filters 115. To reduce resistor network complexity and reduce the required number of digital inputs, the preferred embodiment of the invention uses resistor ladder networks with eight or fewer inputs (i.e., eight or fewer digital inputs to the resistor ladder network in each processing branch).

Figure 11:
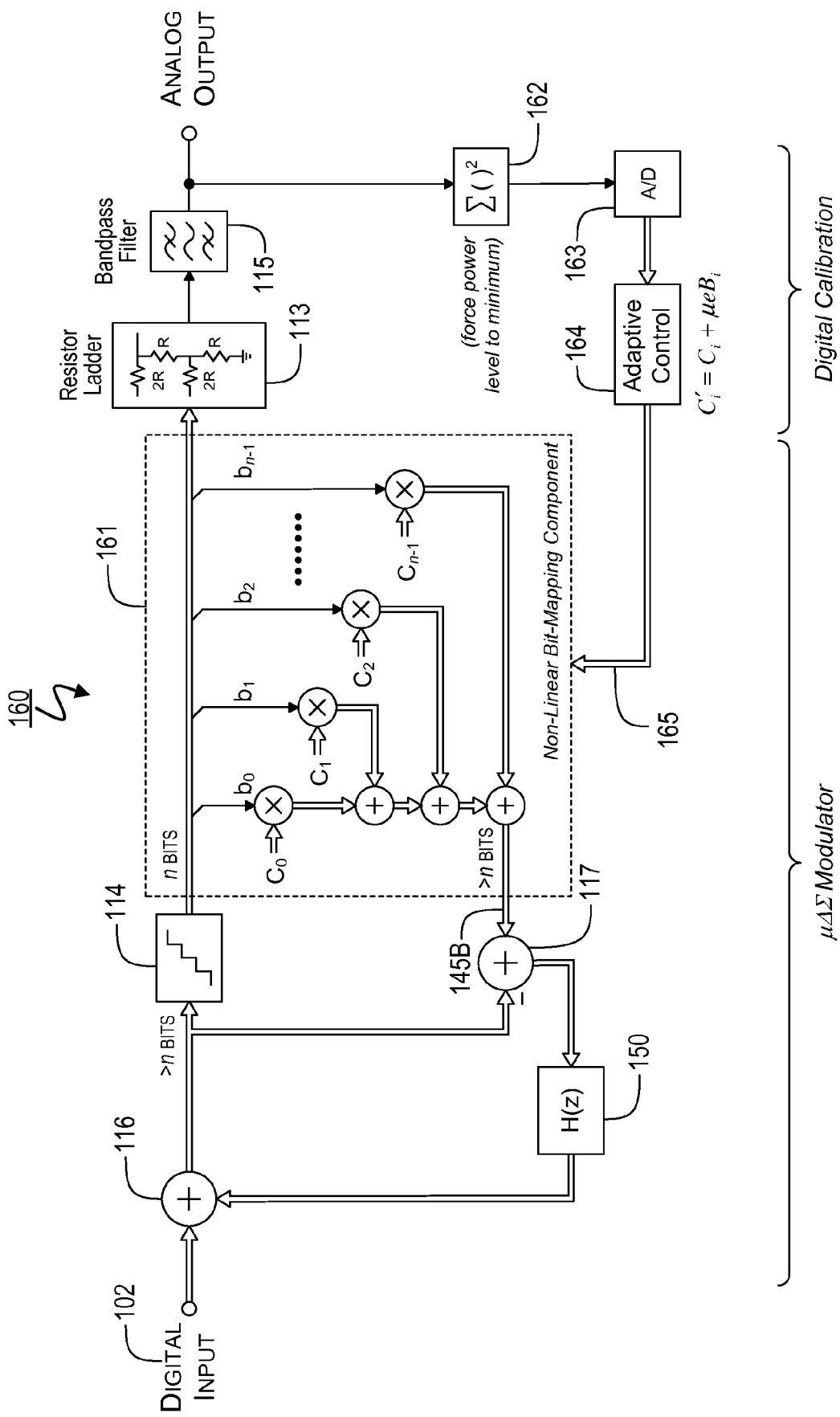
FIG. 11 is a block diagram illustrating a multirate, delta-sigma ($\mu\Delta\Sigma$) modulator that incorporates an adaptive non-linear bit-mapping component to compensate for mismatches in a multi-bit-to-variable-level signal converter, such as a R-2R resistor ladder network.

A second and more significant advantage is that oversampling enables the distortion introduced by mismatches in the resistor ladder network 113 to be shaped by the noise-shaping/quantization circuit 112 and then largely removed by the conversion noise filter 115, through the inclusion of non-linear bit-mapping, e.g., as illustrated in FIG. 11. Oversampling converters employ error feedback to shape conversion noise and distortion. In conventional oversampling schemes, however, the output of the resistor ladder network is not part of the noise-shaping circuit feedback path. Therefore, distortion caused by the imperfect binary scaling of the resistor ladder network 113 conventionally would not be shaped. An MBO converter according to the preferred embodiments of the invention incorporates non-linear bit mapping 161 in the $\mu\Delta\Sigma$ modulator feedback loop, as shown in FIG. 11. The purpose of the non-linear bit mapping 161 is to mimic the nonlinear effects (i.e., mismatches) of the resistor ladder network 113, such that these mismatches effectively become part of the $\mu\Delta\Sigma$ modulator feedback path (i.e., as if the signal 145B had in fact originated from the output of the resistor ladder network 113). This is possible because the level of digital resolution (i.e., bit width>n bits) in the modulator feedback path preferably is greater than the level of digital resolution at the output of the noise-shaping/quantization circuit 112 (i.e., bit width=n bits). That is, each bit output from quantizer 114 (i.e., each of bits $b_0$ to $b_{n-1}$) preferably is multiplied by a multi-bit factor ($C_0$ to $C_{n-1}$, respectively), thereby increasing its resolution from one bit to multiple bits. Using relatively high-resolution weighting factors for each such bit output from quantizer 114, prior to feeding the signal 145B back to adder 116 through feedback-loop filter 150, makes it possible to more accurately match the binary scaling imperfections of the resistor ladder network (or other multi-bit-to-variable-level signal converter).

More precisely, the non-linear bit mapping coefficients, $C_0 \ldots C_{n-1}$, shown in FIG. 11, preferably are set so as to create bit-dependent, binary scaling offsets that coincide with the binary scaling offsets produced by mismatches in the resistive elements of the resistor ladder network 113. If the resistors in the ladder network 113 are perfectly matched, then the non-linear bit mapping coefficients preferably reflect a perfect binary weighting (i.e., $C_2=2 \cdot C_1=4 \cdot C_0$). Otherwise the coefficient weighting is only approximately binary, and because the conversion noise of the $\mu\Delta\Sigma$ modulator is additive with respect to the input signal, the conversion noise level at the output of the reconstruction filter 115 is a minimum when the coefficients and the actual resistor network 113 weighting are perfectly aligned. Therefore, by sensing the signal level (or strength) at the signal reconstruction filter 115 output, e.g., using an analog square-law component 162 (as shown in FIG. 11), or an analog absolute-value component or other sensor of analog signal strength, in conjunction with a low-frequency analog-to-digital converter 163, it is possible to adjust the non-linear bit mapping coefficients $C_0 \ldots C_{n-1}$ for minimum conversion noise and distortion using an adaptive digital control algorithm within processing block 164. With respect to the circuit 160 shown FIG. 11, based on the level at the reconstruction filter 115 output (e.g., as determined in block 162), the algorithm within processing block 164 preferably generates control signals 165 that correct for mismatches between the non-linear bit mapping coefficients $C_0 \ldots C_{n-1}$ and the actual resistor ladder 113 weighting factors. Conventional techniques, such as least mean squares (LMS), may be used within processing block 164 for adapting the non-linear bit-mapping coefficients $C_0 \ldots C_{n-1}$ within the digital calibration loop discussed above.

In practice, the non-linear bit-mapping coefficients $C_0 \ldots C_{n-1}$ preferably are calibrated once upon startup (e.g., using a known signal) and then are dynamically adjusted in real time in order to account for changes in resistance values (e.g., due to thermal changes). In the preferred embodiments, such dynamic adjustments are made on the order of once per second so as to allow for a sufficient amount of time to evaluate the effect of any changes.

Although not shown in FIG. 11, in certain embodiments the digital input signal 102 also is supplied to the adaptive control module 164 in order to take into account any changes in output power that result from changes in the input signal 102. On the other hand, in embodiments where variations in the input signal 102 power are expected to average out to zero over the evaluation period, and/or from one evaluation period to the next, the decisions in the adaptive control module 164 can be made based solely on the average converter output power that is measured in block 162 (as shown in FIG. 11), or based on any other measure of the strength of the signal that is output from the bandpass filter 115.

For a conventional ladder-based converter, the matching accuracy of the resistors in the ladder network determines the precision of the converter. In contrast, the precision of the preferred MBO converter is a function of the converter oversampling ratio (N×M), the noise-shaped response order (P) of the $\mu\Delta\Sigma$ modulators, and the stopband attenuation of the reconstruction filters 115. Therefore, oversampling enables high-accuracy converters to be implemented using low-accuracy resistor ladder networks 113. The preferred embodiment of the invention uses resistor ladder networks with accuracies of just 1% or better to reduce the required tuning range of the non-linear bit-mapping components.

Overall Converter Considerations

Figure 12:
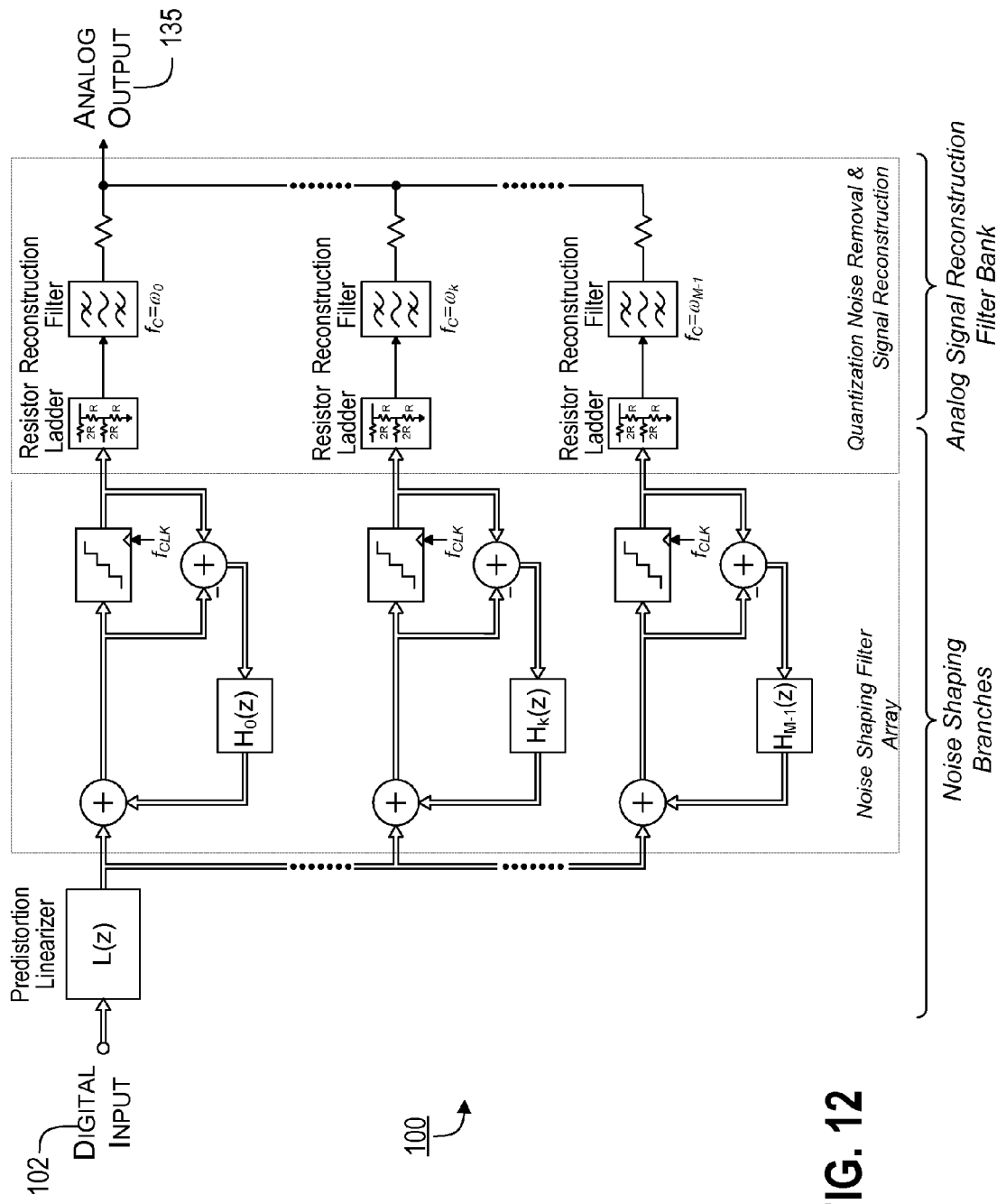
FIG. 12 is a block diagram of a complete MBO converter that incorporates multiple, bandpass delta-sigma modulator noise-shaping circuits in conjunction with resistor ladder networks and an analog signal reconstruction (ASR) filter bank, according to a representative embodiment of the present invention.

Because the digital pre-distortion linearizer (DPL) 104 and the $\mu\Delta\Sigma$ modulators within the noise-shaping/quantization circuits 112 can be implemented as multirate (polyphase) structures, the instantaneous bandwidth of the converter technology illustrated in FIG. 4 (with a more specific and detailed embodiment that incorporates a multirate DPL 104 and multirate noise-shaping/quantization circuits 112 being illustrated in FIG. 12) is limited only by the maximum switching rate of the digital output buffers that drive the resistor ladder networks 113 and by the analog reconstruction filters (e.g., filters 115 and 125).

Figure 13A:
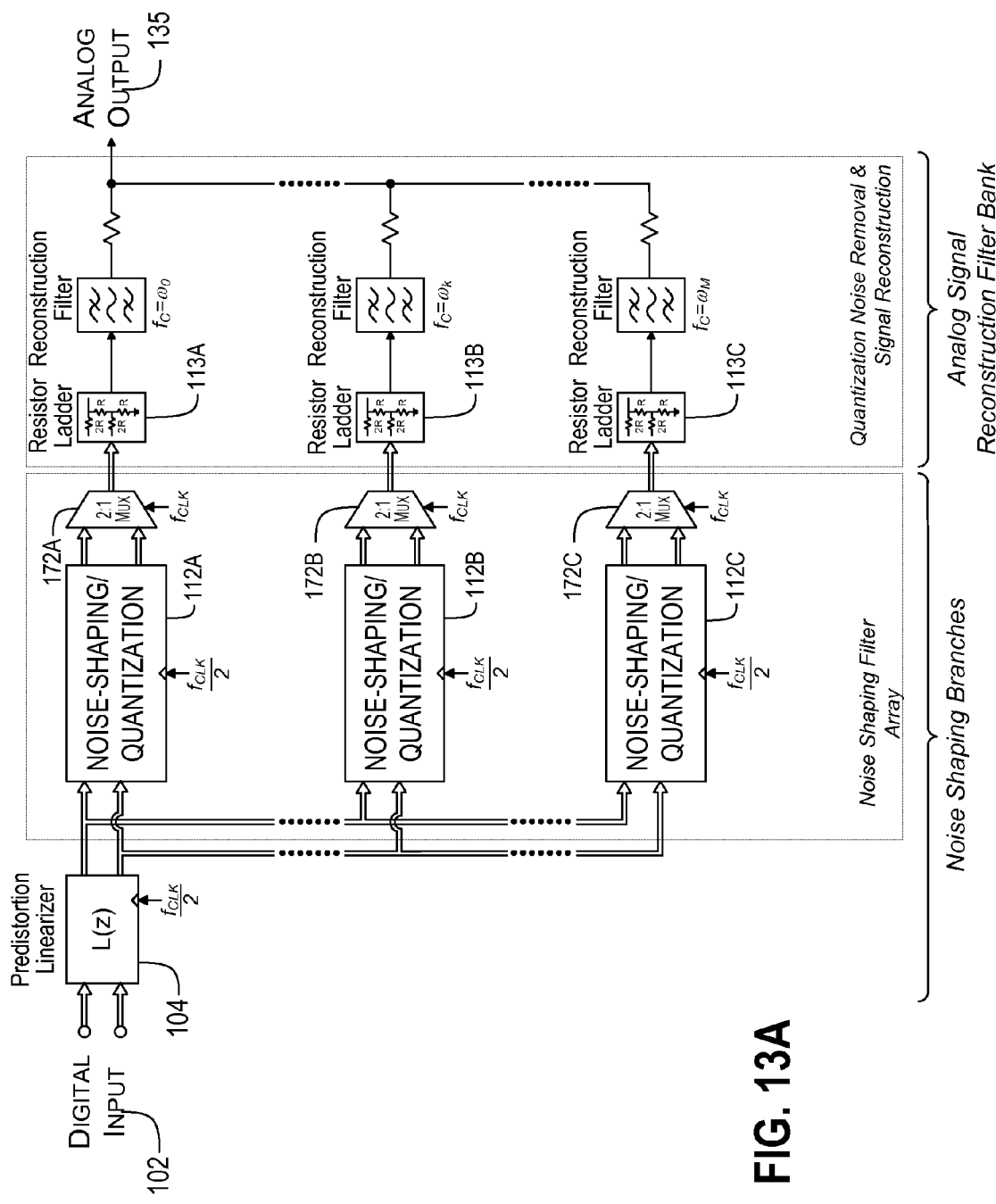
FIG. 13A is a block diagram of a complete MBO converter that incorporates multiple, multirate delta-sigma (μΔΣ) modulator noise-shaping circuits, in conjunction with resistor ladder networks and an analog signal reconstruction (ASR) filter bank, and uses output multiplexing to combine the two multirate outputs of each μΔΣ modulator, according to a representative embodiment of the present invention.
Figure 13B:
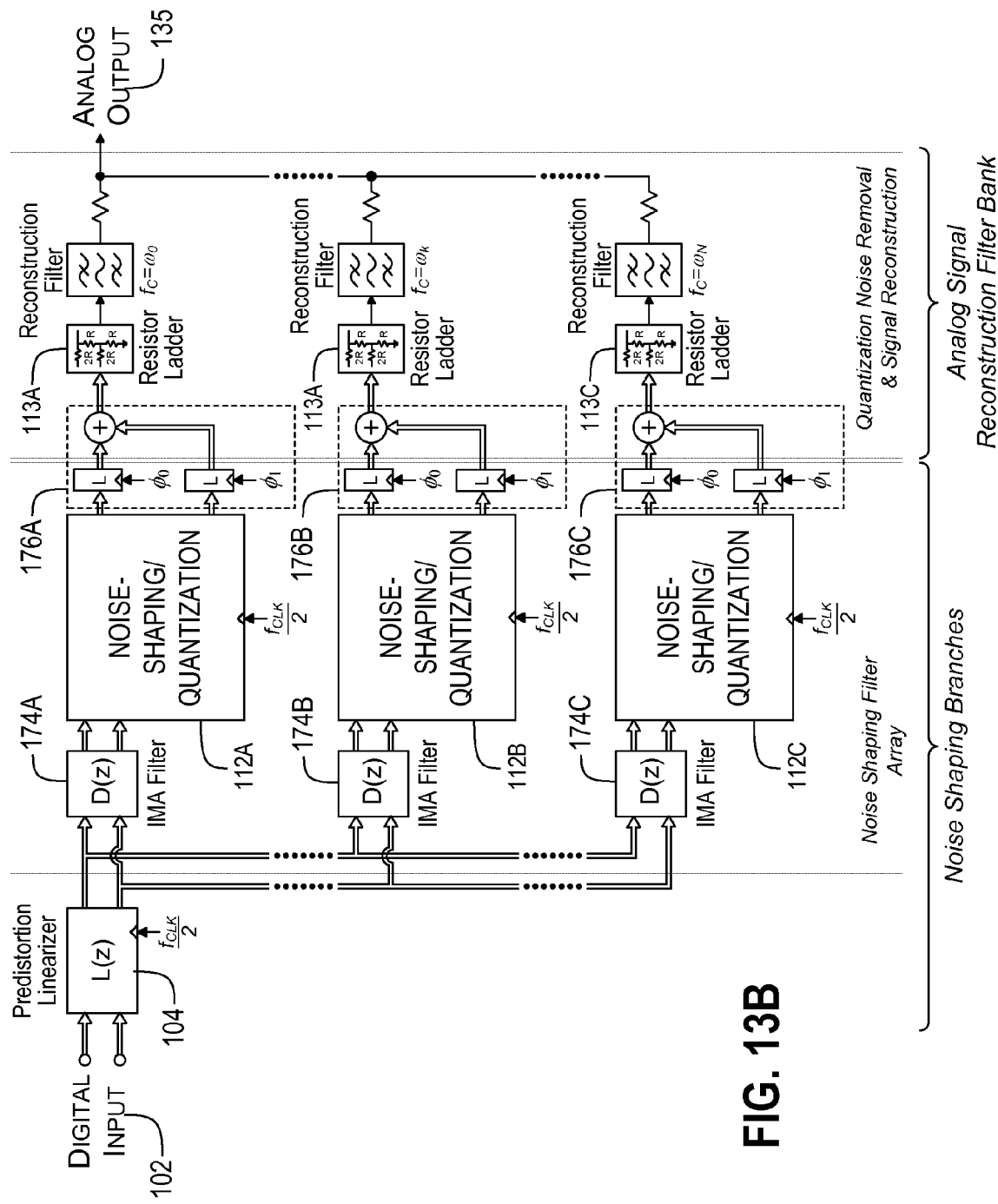
FIG. 13B is a block diagram of a complete MBO converter that incorporates multiple, multirate delta-sigma (μΔΣ) modulator noise-shaping circuits, in conjunction with resistor ladder networks and an analog signal reconstruction (ASR) filter bank, and uses input inverse moving-average (IMA) filtering and output summing to combine the two multirate outputs of each μΔΣ modulator, according to a first alternate embodiment of the present invention.
Figure 13C:
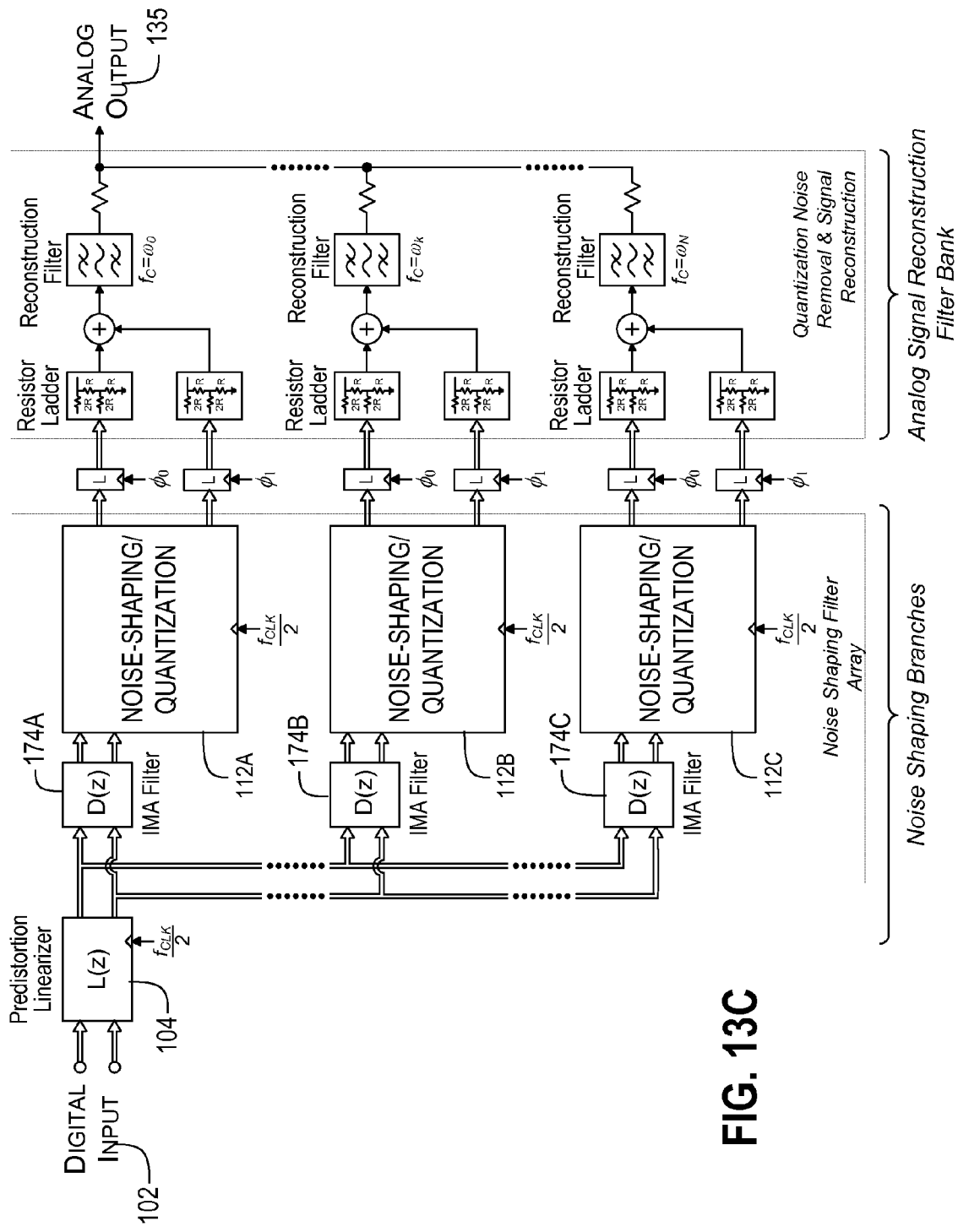
FIG. 13C is a block diagram of a complete MBO converter that incorporates multiple, multirate delta-sigma (μΔΣ) modulator noise-shaping circuits, in conjunction with resistor ladder networks and an analog signal reconstruction (ASR) filter bank, and uses input IMA filtering with additional resistor ladder networks to combine the two multirate outputs of each μΔΣ modulator, according to a second alternate embodiment of the present invention.

Exemplary block diagrams of MBO converters according to the preferred embodiments of the invention, employing noise-shaping/quantization circuits 112 that include $\mu\Delta\Sigma$ modulation with polyphase decomposition factor m=2, are shown in FIGS. 13A-C. In each of FIGS. 13A-C, a different structure is provided for combining the two multirate outputs of each noise-shaping/quantization circuit 112A-C. Also, in each of FIGS. 13A-C, a resistive network is used as an analog adder to combine the outputs of the representative MBO processing branches. However, other types of analog combiners, such as those based on reactive (e.g., Wilkinson, Lange, etc.) and/or active circuits, should be considered within the scope of the invention. In FIG. 13A, each noise-shaping/quantization circuit 112A-C has two multirate outputs, due to its polyphase decomposition factor m=2. The two multirate outputs of each noise-shaping/quantization circuit 112A-C are combined using a corresponding multiplexer 172A-C that selects between the noise-shaping/quantization circuit 112A-C multirate outputs in an alternating and sequential order, thus providing a single data stream to the corresponding resistor ladder network 113A-C. Multiplexer 172A, for example, couples the first multirate output of the noise-shaping/quantization circuit 112A to the resistor ladder network 113A on the first cycle, couples the second multirate path output of the noise-shaping/quantization circuit 112A to the resistor ladder network 113A on the second cycle, then couples the first multirate path output of the noise-shaping/quantization circuit 112A to the resistor ladder network 113A on the third cycle, and so on. Use of multiplexing for combining the multirate outputs of each noise-shaping/quantization circuit 112A-C is preferred because of disadvantages associated with alternate methods that are described in detail below.

FIG. 13B illustrates an alternative structure for combining the two multirate outputs of each noise-shaping/quantization circuit 112A-C. In FIG. 13B, the multirate outputs of each noise-shaping/quantization circuit 112A-C are combined using a corresponding inverse moving-average (IMA) filter 174A-C (between the DPL 104 and the input to the noise-shaping/quantization circuit 112A-C) followed by a summing circuit 176A-C (between the output of the noise-shaping/quantization circuit 112A-C and the input to the resistor ladder 113A-C). As shown, each summing circuit 176A-C includes a clocked latch for each multirate output and an adder to combine the latched outputs. The latches in each summing circuit 176A-C are clocked in a manner that causes latched outputs to update sequentially and at regular intervals. Preferably, the outputs of each latch in the summing circuit update at a $1/m \cdot f_{CLK}$ rate and the outputs of the latches are offset in time by $1/m \cdot (1/f_{CLK})$ with respect to each other, where m is the polyphase decomposition factor of the $\mu\Delta\Sigma$ modulator (i.e., m=2 in FIG. 13B). For the exemplary embodiment illustrated in FIG. 13B for polyphase decomposition factor m=2, the outputs of the latches in each summing circuit 176A-C are updated on opposite phases of the $\frac{1}{2} \cdot f_{CLK}$ clock. Accordingly, the output of the adder in each summing circuit 176A-C updates at an $f_{CLK}$ rate. Therefore, to reduce the switching speed of the digital output logic, the adder preferably is implemented as an analog (i.e., continuous-time) adder, using for example, resistive or reactive combiner networks (e.g., Wye splitters, Wilkinson combiners).

A structure that is similar to that of FIG. 13B is shown in FIG. 13C, in which a IMA filter 174A-C is used in each branch, but each of the multirate outputs for each noise-shaping/quantization circuit 112A-C is separately converted into a single variable-level signal using a resistor ladder network, and then all of such multirate outputs for a given noise-shaping/quantization circuit 112A-C are combined or summed using an analog adder. The following discussion generally refers to the circuit shown in FIG. 13B, but the same considerations apply to the circuit shown in FIG. 13C.

The purpose of the input IMA filters 174A-C is to compensate for the sin(x)/x response introduced by the analog summing components 176A-C (or the corresponding summing structure shown in FIG. 13C). Although shown as distinct entities in FIG. 13B for the purpose of illustration, these analog summing components can be implemented using resistive elements and integrated with the resistor ladder network. Compared to an output multiplexing approach, this output summing approach has the advantage that the switching rate of the digital output buffers (latches) is reduced. However, the output summing approach uses an additional filter (i.e., IMA filters 174A-C with transfer function D(z)) and a digital interface involving multiple clock phases (e.g., $\phi_0$ and $\phi_1$) that can significantly increase circuit complexity for a large interleave factor M and large polyphase decomposition factor m. Furthermore, as described in more detail below, finite word length effects prevent the IMA filtering 174A-C (i.e., D(z)) from fully offsetting the sin(x)/x response of the summing components for polyphase decomposition factors of m>2. For these reasons, the output summing approach preferably is used only with a polyphase decomposition factor of m=2, or in applications that can tolerate sin(x)/x nulls in the converter output spectrum.

Using summing to combine the multirate outputs of the noise-shaping/quantization circuit 112A-C, as illustrated in FIG. 13B, is equivalent to applying a moving-average filter (i.e., with sin(x)/x response) to the MBO converter output samples. This moving-average filter has a transfer function of the form $$TF(z) = \frac{1-z^{-m}}{1-z^{-1}},$$

where m is the polyphase decomposition factor, equal to the number of multirate outputs from the noise-shaping/quantization circuit 112A-C (i.e., m=2 in FIG. 13B). The frequency response of the moving-average filter has spectral nulls at submultiples of the MBO converter output data rate, depending on m. Therefore, in order to cancel the moving-average response of the summing component 176A-C, the corresponding IMA filter 174A-C (shown before each noise-shaping/quantization circuit 112A-C in FIG. 13B), should have the inverse transfer function, given by $$D(z) = \frac{1-z^{-1}}{1-z^{-m}}.$$

Figure 14:
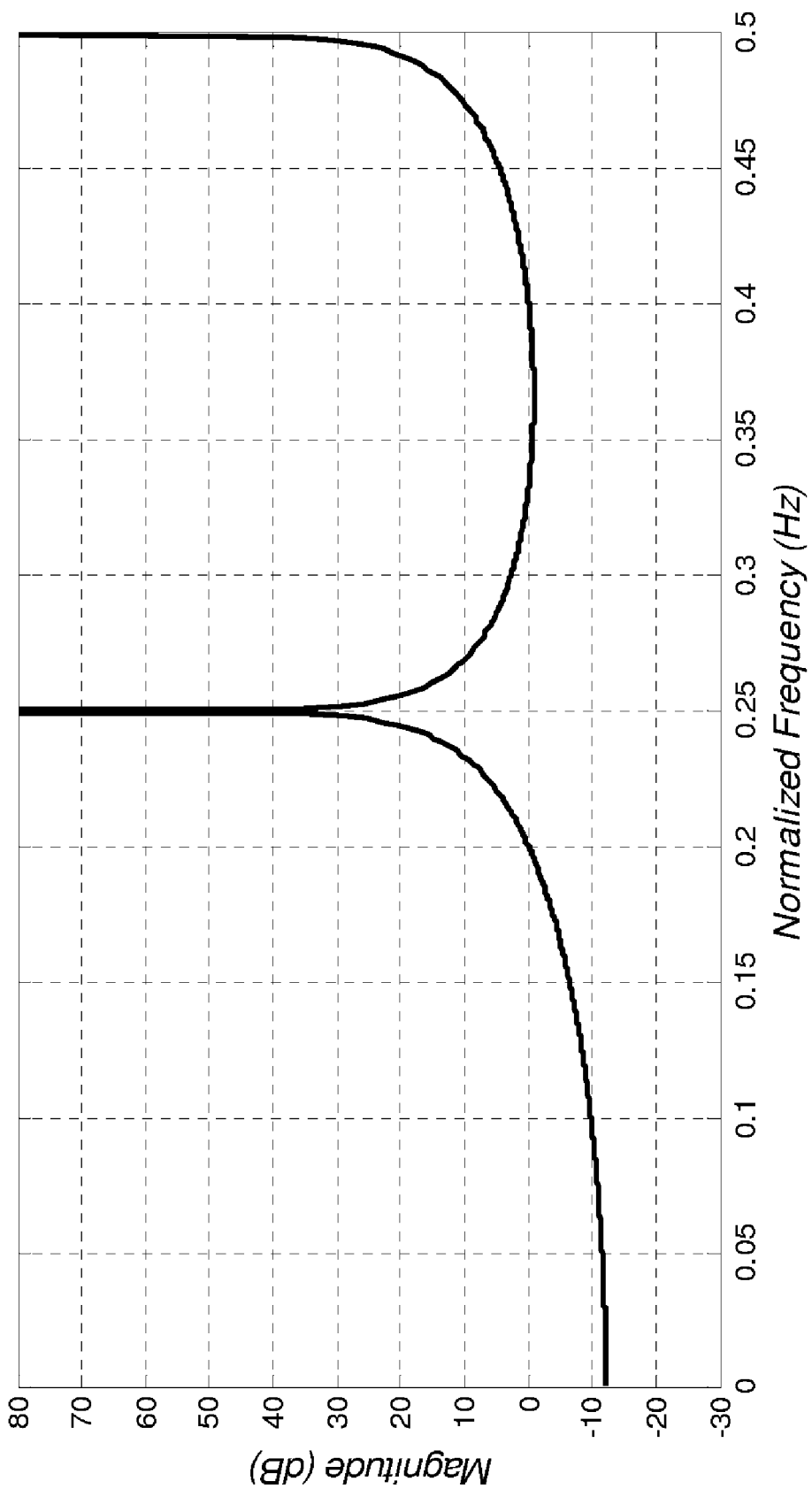
FIG. 14 illustrates an IMA filter transfer function based on a moving-average factor of four.

The frequency response of an IMA filter is illustrated in FIG. 14, for a polyphase decomposition factor of m=4, and has infinite magnitude at $\frac{1}{4} \cdot f_S$, where $f_S$ is the converter output data rate. As a result, an IMA filter 174A-C with finite gain (i.e., finite word length for a digital filter), cannot perfectly compensate for the nulls produced by the summing (i.e., moving-average) component 176A-C at the $\mu\Delta\Sigma$ modulator output. In general, the moving-average response produces such spectral nulls at frequencies equal to $1/m \cdot f_S$. This means that for a polyphase decomposition factor of m=2, the spectral null in the moving-average response occurs at the Nyquist frequency, which can be eliminated from the MBO converter output with little or no consequence in terms of overall converter bandwidth. Therefore, combining the multirate outputs of the noise-shaping/quantization circuit 112A-C using summing components is preferable only for combining up to two multirate output (i.e., m=2).

Figure 15:
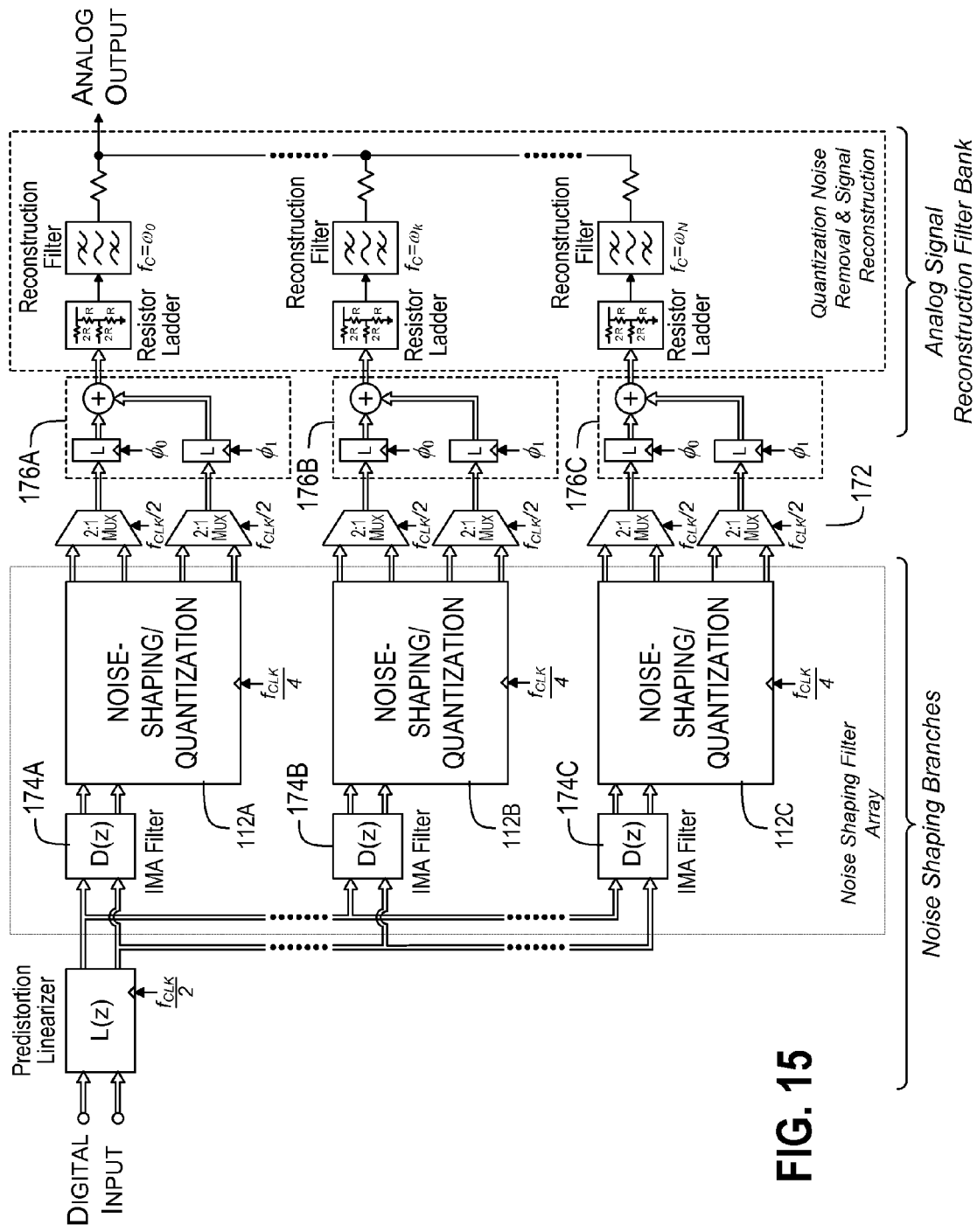
FIG. 15 is a block diagram of a complete MBO converter that incorporates multiple, multirate delta-sigma (μΔΣ) modulator noise-shaping circuits, in conjunction with resistor ladder networks and an analog signal reconstruction (ASR) filter bank, and uses a combination of input IMA filtering, output multiplexing, and output summing to combine the four multirate outputs of each μΔΣ modulator, according to a fourth alternate embodiment of the present invention.

As illustrated in FIG. 15, multiplexing and summing can be used together in a hybrid configuration for combining the multirate outputs of the noise-shaping/quantization circuit 112A-C. This hybrid approach, shown in FIG. 15 for an exemplary polyphase decomposition factor of m=4, uses multiplexing 172 to combine all but the last two multirate outputs, and then combines the last two multirate outputs using IMA filter 174A-C with summing 176A-C (i.e., in this example using analog adders rather than additional resistor ladder networks). Therefore, the IMA filters 174A-C and the summing components 176A-C operate on the basis of a polyphase decomposition factor of m=2, even though the overall polyphase decomposition factor for each noise-shaping/quantization circuit 112A-C is m=4. This hybrid approach results in a times-two increase in the MBO converter output data rate, without loss of performance due to mismatches between the IMA filter 174A-C response and the moving-average response of the summing components 176A-C. It should be noted that any of the methods described above for combining the multirate outputs of the noise-shaping/quantization circuit 112A-C can be generalized to a larger number of multirate outputs (i.e., a larger polyphase decomposition factor m) by using higher-order multiplexers or higher-order differentiators and summers.

Several of the embodiments described above incorporate both IMA filters 174A-C and a digital pre-distortion linearizer (DPL) 104. However, in alternate embodiments these different filtering functions are incorporated into a single structure.

The instantaneous bandwidth of the MBO converter technology (e.g., as shown in FIG. 4) is limited only by the switching rate of the digital output buffers (or latches) that are coupled to the resistor ladder network 113, or other circuitry used to convert binary-weighted digital signals to proportional analog voltage levels. Digital output buffers currently have been demonstrated commercially at switching speeds in excess of 10 GHz in CMOS integrated circuit process technology. When using the preceding hybrid approach for combining multirate outputs, for example, this capability translates into an overall converter sample rate $f_S$ of up to 20 GHz and a corresponding instantaneous bandwidth in excess of 10 GHz.

As noted previously, however, the resolution performance of the MBO converter 100 is not limited by the sample rate $f_S$, but is also a function of the interleave factor (i.e., the number of parallel processing branches M), the $\mu\Delta\Sigma$ modulator noise-shaping order, and the bandpass (reconstruction) filter 115 properties. In addition, like conventional oversampling converters, the MBO converter technology can be implemented so as to be relatively insensitive to impairments such as clock jitter and thermal noise that degrade the performance of other high-speed converter architectures. Specifically, impairments such as clock jitter and quantizer thermal noise can be made subject to a noise-shaped response in a similar manner to quantization noise, exhibiting a frequency response that enables significant attenuation by the analog bandpass (reconstruction) filters (e.g., filters 115 and 125).

Simulated resolution performance results for the MBO converter 100 are given in Table 1 for a $6^{th}$ order noise-shaped response, various interleave factors M, and various analog reconstruction filter 115 orders.

TABLE 1

Simulated Two-Tone Performance Results for OBO Converter

| Interleave Factor | Analog Filter Order | SNDR (Effective Bits) |
|---|---|---|
| 9 | 5 | 64 dB (10.9 bits) |
| 6 | 5 | 60 dB (10.2 bits) |
| 3 | 5 | 46 dB (7.8 bits) |
| 6 | 7 | 68 dB (11.5 bits) |
| 3 | 7 | 49 dB (8.4 bits) |

System Environment

Generally speaking, except where clearly indicated otherwise, all of the systems, methods, functionality and techniques described herein can be practiced with the use of one or more programmable general-purpose computing devices. Such devices typically will include, for example, at least some of the following components interconnected with each other, e.g., via a common bus: one or more central processing units (CPUs); read-only memory (ROM); random access memory (RAM); input/output software and circuitry for interfacing with other devices (e.g., using a hardwired connection, such as a serial port, a parallel port, a USB connection or a firewire connection, or using a wireless protocol, such as Bluetooth or a 802.11 protocol); software and circuitry for connecting to one or more networks, e.g., using a hardwired connection such as an Ethernet card or a wireless protocol, such as code division multiple access (CDMA), global system for mobile communications (GSM), Bluetooth, a 802.11 protocol, or any other cellular-based or non-cellular-based system, which networks, in turn, in many embodiments of the invention, connect to the Internet or to any other networks; a display (such as a cathode ray tube display, a liquid crystal display, an organic light-emitting display, a polymeric light-emitting display or any other thin-film display); other output devices (such as one or more speakers, a headphone set and a printer); one or more input devices (such as a mouse, touchpad, tablet, touch-sensitive display or other pointing device, a keyboard, a keypad, a microphone and a scanner); a mass storage unit (such as a hard disk drive); a real-time clock; a removable storage read/write device (such as for reading from and writing to RAM, a magnetic disk, a magnetic tape, an opto-magnetic disk, an optical disk, or the like); and a modem (e.g., for sending faxes or for connecting to the Internet or to any other computer network via a dial-up connection). In operation, the process steps to implement the above methods and functionality, to the extent performed by such a general-purpose computer, typically initially are stored in mass storage (e.g., the hard disk), are downloaded into RAM and then are executed by the CPU out of RAM. However, in some cases the process steps initially are stored in RAM or ROM.

Suitable general-purpose programmable devices for use in implementing the present invention may be obtained from various vendors. In the various embodiments, different types of devices are used depending upon the size and complexity of the tasks. Such devices can include, e.g., mainframe computers, multiprocessor computers, workstations, personal computers and/or even smaller computers, such as PDAs, wireless telephones or any other programmable appliance or device, whether stand-alone, hard-wired into a network or wirelessly connected to a network.

In addition, although general-purpose programmable devices have been described above, in many of the preferred embodiments, as indicated above, one or more special-purpose processors or computers instead (or in addition) are used. In general, it should be noted that, except as expressly noted otherwise, any of the functionality described above can be implemented by a general-purpose processor executing software and/or firmware, by dedicated (e.g., logic-based) hardware, or any combination of these, with the particular implementation being selected based on known engineering tradeoffs. More specifically, where any process and/or functionality described above is implemented in a fixed, predetermined and/or logical manner, it can be accomplished by a general-purpose processor executing programming (e.g., software or firmware), an appropriate arrangement of logic components (hardware), or any combination of the two, as will be readily appreciated by those skilled in the art. In other words, it is well-understood how to convert logical and/or arithmetic operations into instructions for performing such operations within a processor and/or into logic gate configurations for performing such operations; in fact, compilers typically are available for both kinds of conversions.

It should be understood that the present invention also relates to machine-readable tangible media on which are stored software or firmware program instructions (i.e., computer-executable process instructions) for performing the methods and functionality of this invention. Such media include, by way of example, magnetic disks, magnetic tape, optically readable media such as CD ROMs and DVD ROMs, or semiconductor memory such as PCMCIA cards, various types of memory cards, USB memory devices, etc. In each case, the medium may take the form of a portable item such as a miniature disk drive or a small disk, diskette, cassette, cartridge, card, stick etc., or it may take the form of a relatively larger or immobile item such as a hard disk drive, ROM or RAM provided in a computer or other device. As used herein, unless clearly noted otherwise, references to computer-executable process steps stored on a computer-readable or machine-readable medium are intended to encompass situations in which such process steps are stored on a single medium, as well as situations in which such process steps are stored across multiple media.

The foregoing description primarily emphasizes electronic computers and devices. However, it should be understood that any other computing or other type of device instead may be used, such as a device utilizing any combination of electronic, optical, biological and chemical processing that is capable of performing basic logical and/or arithmetic operations.

In addition, where the present disclosure refers to a processor, computer, server device, computer-readable medium or other storage device, client device, or any other kind of device, such references should be understood as encompassing the use of plural such processors, computers, server devices, computer-readable media or other storage devices, client devices, or any other devices, except to the extent clearly indicated otherwise. For instance, a server generally can be implemented using a single device or a cluster of server devices (either local or geographically dispersed), e.g., with appropriate load balancing.

Additional Considerations

Several different embodiments of the present invention are described above, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the spirit and the scope of the invention. Accordingly, the invention is not limited to the precise embodiments shown in the drawings and described above. Rather, it is intended that all such variations not departing from the spirit of the invention be considered as within the scope thereof as limited solely by the claims appended hereto.

What is claimed is:

1. An apparatus for converting a discrete-time quantized signal into a continuous-time, continuously variable signal, comprising:
    an input line for accepting an input signal that is discrete in time and in value;
    a plurality of processing branches coupled to the input line, each of said processing branches including: (a) a discrete-time noise-shaping/quantization circuit, (b) a multi-bit-to-variable-level signal converter coupled to an output of the discrete-time noise-shaping/quantization circuit, and (c) an analog bandpass filter coupled to an output of the multi-bit-to-continuously-variable signal converter; and
    an adder coupled to an output of the analog bandpass filter in each of the processing branches,
    wherein the discrete-time noise-shaping/quantization circuits in different ones of the plurality of processing branches have conversion-noise frequency-response minima at different frequencies, and
    wherein each of the discrete-time noise-shaping/quantization circuits has a conversion-noise frequency-response minimum that corresponds to a frequency band selected by the analog bandpass filter in the same processing branch.

2. An apparatus according to claim 1, wherein the discrete-time noise-shaping/quantization circuit in each of a plurality of the processing branches comprises:
    an input;
    a second adder having a first input coupled to the input of the discrete-time noise-shaping/quantization circuit, a second input and an output;
    a quantization circuit that reduces a bit-width resolution of a signal, that has an input coupled to the output of the second adder, and that has an output coupled to the output of the discrete-time noise-shaping/quantization circuit; and
    a feedback-loop filter having an input coupled to the output of the quantization circuit and an output coupled to the second input of the second adder.

3. An apparatus according to claim 2, wherein the input of the quantization circuit also is coupled to the input of the feedback-loop filter so that both the input and the output of the quantization circuit are coupled to the second input of the adder through the feedback-loop filter.

4. An apparatus according to claim 2, wherein the output of the quantization circuit comprises at least 4 bits.

5. An apparatus according to claim 2, wherein for at least one of the processing branches, the entire configuration recited in claim 2 is replicated across plural parallel paths, with each said parallel path generating a different subsampling phase of a complete signal that is output by the discrete-time noise-shaping/quantization circuit.

6. An apparatus according to claim 2, wherein the feedback-loop filter in each of a plurality of the processing branches has a conversion noise transfer function with a plurality of zeros, and wherein none of said zeros is equal to any other of said zeros.

7. An apparatus according to claim 6, wherein each of said zeros is produced by a settable parameter of the feedback-loop filter that is represented by not more than 6 bits.

8. An apparatus according to claim 2, wherein the feedback-loop filters have identical structures across the plurality of processing branches, but have different values for at least one settable parameter.

9. An apparatus according to claim 2, wherein at least one of the processing branches includes non-linear bit mapping to compensate for imperfections in scaling parameters of the multi-bit-to-variable-level signal converter in said at least one of the processing branches.

10. An apparatus according to claim 9, wherein the non-linear bit mapping is dynamically adjusted based on an error metric that minimizes output conversion noise.

11. An apparatus according to claim 1, wherein the multi-bit-to-variable-level signal converter in each of a plurality of the processing branches comprises at least one of: a network of weighted resistors, a network of weighted voltage sources, or a network of weighted current sources.

12. An apparatus according to claim 1, further comprising a digital pre-distortion linearizing filter having an input coupled to the input line and an output coupled to the processing branches, wherein the digital pre-distortion linearizing filter has a transfer function that produces an at least approximately all-pass response when convolved with a composite transfer function that represents the combined transfer functions of the analog bandpass filters in the processing branches.

13. An apparatus according to claim 12 where the digital pre-distortion linearizing filter is implemented as a polyphase structure and includes, for each subsampling phase, a substructure that operates at a clock rate that is a submultiple of a clock rate for the digital pre-distortion linearizing filter as a whole.

14. An apparatus according to claim 12 where the digital pre-distortion linearizing filter includes both feedforward and feedback components.

15. An apparatus according to claim 1, where the analog bandpass filters include at least one of a Butterworth, Bessel, and elliptic filter structure.

16. An apparatus according to claim 1, wherein the discrete-time noise-shaping/quantization circuit in each of a plurality of the processing branches is implemented as a polyphase structure and includes separate parallel substructures for generating different corresponding subsampling phases of a complete signal that is output by the discrete-time noise-shaping/quantization circuit as a whole.

17. An apparatus according to claim 16, wherein outputs of the substructures are combined into a single composite output using at least one multiplexer.

18. An apparatus according to claim 16, wherein outputs of the substructures are combined into a single composite output using at least one inverse moving-average filter in conjunction with at least one summing component.

19. An apparatus according to claim 16, wherein outputs of the substructures are combined into a single composite output using a combination of at least one multiplexer and at least one inverse moving-average filter in conjunction with at least one summing component.

20. An apparatus for converting a discrete-time quantized signal into a continuous-time, continuously variable signal, comprising:
an input line for accepting an input signal that is discrete in time and in value;
a discrete-time noise-shaping/quantization circuit having an input coupled to the input line and having a plurality of parallel paths, each said parallel path generating a different subsampling phase of a complete signal that is output by the discrete-time noise-shaping/quantization circuit;
a multi-bit-to-variable-level signal converter coupled to an output of the discrete-time noise-shaping/quantization circuit; and
an analog bandpass filter coupled to an output of the multi-bit-to-continuously-variable signal converter,
wherein the discrete-time noise-shaping/quantization circuit has a conversion-noise frequency-response minimum that corresponds to a frequency band selected by the analog bandpass filter.

21. An apparatus according to claim 20, wherein each of said parallel paths includes:
an input;
an adder having a first input coupled to an input of the discrete-time noise-shaping/quantization circuit, a second input and an output;
a quantization circuit that reduces a bit-width resolution of a signal and that has an input coupled to the output of the adder and an output; and
a feedback-loop filter having an input coupled to the output of the quantization circuit and an output coupled to the second input of the adder.

22. An apparatus according to claim 21, wherein the feedback-loop filter in each of the parallel paths has a conversion noise transfer function with a plurality of zeros, and wherein none of said zeros is equal to any other of said zeros.

23. The apparatus of claim 20, wherein each of the parallel paths includes non-linear bit mapping to compensate for imperfections in scaling parameters of the multi-bit-to-variable-level signal converter.

24. The apparatus of claim 23, wherein the non-linear bit mapping function is dynamically adjusted based on an error metric that minimizes output conversion noise.

25. The apparatus of claim 20, wherein outputs of the parallel paths are combined into a single output using at least one multiplexer.

26. The apparatus of claim 20, wherein outputs of the parallel paths are combined into a single output using at least one inverse moving-average filter in conjunction with at least one summing component.

27. The apparatus of claim 20, wherein outputs of the parallel paths are combined into a single output using a combination of at least one multiplexer and at least one inverse moving filter in conjunction with at least one summing component.

28. An apparatus according to claim 20, wherein an output of each of the parallel paths is independent of any present signal generated in others of the parallel paths.

29. An apparatus for converting a discrete-time quantized signal into a continuous-time, continuously variable signal, comprising:
an input line for accepting an input signal that is discrete in time and in value;

an adder having a first input coupled to the input line, a second input and an output;

a multi-bit-to-variable-level signal converter coupled to the output of the adder;

an analog bandpass filter coupled to an output of the multi-bit-to-continuously-variable signal converter;

a non-linear bit-mapping component, having an input coupled to the output of the adder and also having an output, that scales different bits of a multi-bit signal at its input by different multi-bit factors; and a feedback-loop filter having an input coupled to the output of the non-linear bit-mapping component and an output coupled to the second input of the adder.

30. An apparatus according to claim 29, wherein the different multi-bit factors are selected so as to approximate corresponding bit mismatches in the multi-bit-to-variable-level signal converter.

31. An apparatus according to claim 29, further comprising a sensor that measures signal strength at its input, and wherein the different multi-bit factors are dynamically adjusted to minimize the signal strength measured by the sensor.

32. An apparatus according to claim 31, wherein the input of the sensor is coupled to the output of the analog bandpass filter.

33. An apparatus according to claim 29, further comprising a quantization circuit that reduces a bit-width resolution of a signal, that has an input coupled to the output of the adder, and that has an output coupled to the input of the multi-bit-to-variable-level signal converter and also coupled through the non-linear bit-mapping component to the input of the feedback-loop filter.

34. An apparatus according to claim 33, wherein the input of the quantization circuit also is coupled to the input of the feedback-loop filter so that both the input and the non-linear bit-mapped output of the quantization circuit are coupled to the second input of the adder through the feedback-loop filter.

* * * * *